United States Patent
Miyazaki et al.

(10) Patent No.: US 7,759,224 B2
(45) Date of Patent: *Jul. 20, 2010

(54) FABRICATION METHOD OF SEMICONDUCTOR INTEGRATED CIRCUIT DEVICE

(75) Inventors: Chuichi Miyazaki, Akishima (JP); Yoshiyuki Abe, Hinode (JP); Toshihide Uematsu, Hinode (JP); Minoru Kimura, Tachikawa (JP); Kazunari Suzuki, Ota (JP); Masao Odagiri, Musashimurayama (JP); Hideyuki Suga, Hamura (JP); Manabu Takata, Hamura (JP)

(73) Assignee: Renesas Technology Corp., Tokyo (JP)

( * ) Notice: Subject to any disclaimer, the term of this patent is extended or adjusted under 35 U.S.C. 154(b) by 180 days.

This patent is subject to a terminal disclaimer.

(21) Appl. No.: 12/170,020

(22) Filed: Jul. 9, 2008

(65) Prior Publication Data

US 2008/0286948 A1 Nov. 20, 2008

Related U.S. Application Data

(63) Continuation of application No. 11/020,049, filed on Dec. 23, 2004, now Pat. No. 7,452,787.

(30) Foreign Application Priority Data

Dec. 26, 2003 (JP) ............................. 2003-431866
Feb. 13, 2004 (JP) ............................. 2004-036966

(51) Int. Cl.
  *H01L 21/00* (2006.01)
(52) U.S. Cl. .................. 438/464; 257/E21.499; 438/460; 438/110
(58) Field of Classification Search .................. 438/464
  See application file for complete search history.

(56) References Cited

U.S. PATENT DOCUMENTS 6,165,873 A 12/2000 Hamada
6,750,074 B2 6/2004 Teshirogi et al.

(Continued)

FOREIGN PATENT DOCUMENTS

CN 1254440 A 5/2000

(Continued)

OTHER PUBLICATIONS

Chinese Official Action dated Sep. 4, 2009, in Application No. 200810109589.3.

*Primary Examiner*—David A Zarneke
(74) *Attorney, Agent, or Firm*—Antonelli, Terry, Stout & Kraus, LLP.

(57) ABSTRACT

A technique capable of stably releasing chips from a dicing tape, includes grinding a back surface of a semiconductor wafer, while adhering a pressure sensitive adhesive tape to a circuit forming surface of the semiconductor wafer formed with an integrated circuit, to achieve a predetermined thickness and forcibly oxidizing the back surface of the semiconductor wafer. Then, the pressure sensitive adhesive tape adhered to the circuit forming surface of the semiconductor wafer is released, and a dicing tape is adhered to the back surface of the semiconductor wafer. Further, the semiconductor wafer is divided by dicing it into individual chips, and then the back surface of the chip is pressed by way of the dicing tape, thereby releasing the chips from the dicing tape.

5 Claims, 19 Drawing Sheets

U.S. PATENT DOCUMENTS

| | | |
|---|---|---|
| 6,812,064 B2 | 11/2004 | Jiang et al. |
| 6,908,784 B1 | 6/2005 | Farnworth et al. |
| 7,122,447 B2 | 10/2006 | Abe |
| 7,157,353 B2 | 1/2007 | Farnworth et al. |
| 2002/0110949 A1 | 8/2002 | Tonti et al. |
| 2002/0197877 A1 | 12/2002 | Arita et al. |
| 2003/0088959 A1 | 5/2003 | Tsujimoto |

FOREIGN PATENT DOCUMENTS

| | | |
|---|---|---|
| JP | 10-308387 | 11/1998 |
| JP | 2003-133395 | 5/2003 |
| JP | 2003-152058 | 5/2003 |
| JP | 2003-179023 | 6/2003 |

FABRICATION METHOD OF SEMICONDUCTOR INTEGRATED CIRCUIT DEVICE

CROSS-REFERENCE TO RELATED APPLICATION

The present application claims priority from Japanese patent application No. 2004-036966, filed on Feb. 13, 2004, and Japanese patent application No. 2003-431866, filed on Dec. 26, 2003, the contents of both of which are hereby incorporated by reference into this application. This application is a Continuation application of application Ser. No. 11/020,049, filed Dec. 23, 2004 now U.S. Pat. No. 7,452,787, the contents of which are incorporated herein by reference in their entirety.

BACKGROUND OF THE INVENTION

The present invention concerns a method of fabrication of a semiconductor integrated circuit device; and, more particularly, it relates to a technique which is effective when applied to the fabrication of a semiconductor integrated circuit device including the processing, after substantial completion of the formation of a circuit pattern on a semiconductor wafer, from the back grinding step of grinding the back surface of a semiconductor wafer to the dicing step of cutting a semiconductor chip into individual chips, further including the die bonding step of picking-up and mounting the chip on a substrate.

In the fabrication steps of back grinding a semiconductor wafer, dividing the semiconductor wafer by dicing into individual chips and die bonding to effect the mounting of individual chips on a substrate, a semiconductor wafer is conveyed and subjected to predetermined treatment while being bonded to a tape.

For example, Japanese Unexamined Patent Publication No. 2003-152058 (Patent Literature 1) describes a wafer transfer device comprising a first UV-ray irradiation unit for irradiating UV-rays to a protective tape, a positioning unit for positioning a wafer, a mount unit integrated with a ring frame, a protective tape releasing unit for releasing the protective tape from the surface of the wafer and a second UV-ray irradiation unit for irradiating UV-rays to a dicing tape. The device can transfer the wafer, which is bonded to the protective tape, continuously and automatically to a dicing tape and a ring frame, irrespective of the kind of protective tape and dicing tape to be used, while releasing the protective tape.

Further, for effectively performing a back surface grinding treatment and an etching treatment to be applied to the back surface of a wafer, Japanese Unexamined Patent Publication No. 2003-179023 (Patent Literature 2) describes the in-line constitution of a grinder device for back grinding the back surface of a wafer that is adhered to a protective tape at the circuit forming surface thereof, a back side etching device for back side etching the back surface that has been ground by the grinder device and a transfer device for transferring the wafer to a dicing tape, while releasing the protective tape from the wafer.

Further, Japanese Unexamined Patent Publication No. 2003-133395 (Patent Literature 3) describes a technique for conducting a bonding step, a back grinding step, a tape exchange step, a picking-up step and a die bonding step using a wafer fixing jig comprising an outer frame and a rubber membrane disposed in the outer frame that increases and decreases in volume while deforming in shape in response to the supply air to the inside thereof, in which a tape disposed between the wafer and the rubber membrane is deformed so as to be gradually urged from the center toward the outer side of the wafer when the rubber member increases in volume.

[Patent Literature 1] Japanese Unexamined Patent Publication No. 2003-152058
[Patent Literature 2] Japanese Unexamined Patent Publication No. 2003-179023
[Patent Literature 3] Japanese Unexamined Patent Publication No. 2003-133395

SUMMARY OF THE INVENTION

Various technical aspects are present in the fabrication steps of back grinding a semiconductor wafer, dividing the semiconductor wafer by dicing into individual chips and die bonding for mounting the individual chips on a substrate. The steps in question proceed as described below.

At first, after adhering a pressure sensitive adhesive tape to a circuit forming surface of a semiconductor wafer, the semiconductor wafer is mounted on a grinder device, and the back surface of the semiconductor wafer is ground by urging a rotating grinding member against the surface thereof, thereby reducing the thickness of the semiconductor wafer to a predetermined thickness (back grinding step). Successively, the back surface of the semiconductor wafer is adhered to a dicing tape which is secured to a ring-like frame, and the pressure sensitive adhesive tape is released from the circuit forming surface of the semiconductor wafer (wafer mounting step).

Then, the semiconductor wafer is cut along a predetermined scribe line, and the semiconductor wafer is divided into individual chips (dicing step). Each individual chip is urged at the back surface thereof by a push-up pin by way of a dicing tape, by which the chip is released from the dicing tape. A collet is positioned above the chip at a position opposite the push-up pin, and the released chip is adsorbed and held by the collet (pick-up step). Then, the chip held on the collet is conveyed to a substrate and bonded to a predetermined position on the substrate (die bonding step).

By the way, along with a down sizing and thickness reduction of electronic equipment, there is also a demand to reduce the thickness of the chips mounted on a substrate. Further, a stacked type semiconductor integrated circuit device formed by stacking plural chips and mounting them on one package has been developed, and the demand for a reduction of the thickness of such a chip has been increasing more and more. Accordingly, in the back grinding step, grinding is conducted to decrease the thickness of the semiconductor wafer from a previous thickness of 200 μm or so to less than 100 μm. However, when the thickness of a semiconductor wafer is reduced to less than 100 μm, a warping tends to be induced in the semiconductor wafer so as to cause a disadvantage in the handling or the transport of the semiconductor wafer in a subsequent step, to the extent that the semiconductor wafer sometimes cracks.

In view of the above, a method has been studied for reducing the thickness of a semiconductor wafer to less than 100 μm in the back grinding step, then adsorbing the back surface of the semiconductor wafer in a vacuum using a wafer transportation jig in a state of mounting the wafer on the chuck table of a grinder device and conveying the same as it is to a wafer mounting device. The semiconductor wafer can be conveyed with no warp to the wafer mounting device can be and adhered at the back surface thereof to the dicing tape.

However, just after the back grinding (less than 0 to 4 hours), since the back surface of semiconductor wafer is activated, the glue of the dicing tape and the back surface of the semiconductor wafer are joined so as to cause a problem in that the chip can not be released from the dicing tape. In a case where the chip can not be released, it can not be held by the collet, thereby resulting in a lowering of the production yield of the semiconductor products.

Further, since a semiconductor wafer with a thickness of 100 μm or more, or 200 μm or more, causes less warping, it can be left for 4 hours or more, during which a spontaneous oxide layer is formed on the back surface of the semiconductor wafer, thereby avoiding the problem described above. However, it is necessary to leave the semiconductor wafer until the spontaneous oxide layer is formed, which inevitably lowers the TAT (turn around time).

It is an object of the present invention to provide a technique that is capable of stably releasing a chip from a dicing tape.

The invention has the further object of providing a technique that is capable of improving the yield of semiconductor products and shortening the TAT.

The foregoing and other objects and novel features of the invention will become apparent by reading the descriptions provided in the present specification in conjunction with the appended drawings.

Among the aspects and features of the invention disclosed in the present application, an outline of typical features is described simply below.

In one of the aspects of the invention, after grinding the back surface of a semiconductor wafer to a predetermined thickness, while adhering a pressure sensitive adhesive tape to a circuit forming surface of a semiconductor wafer that is formed with a circuit pattern, the back surface of the semiconductor wafer is forcibly oxidized. Subsequently, the pressure sensitive adhesive tape that is adhered to the circuit forming surface of the semiconductor wafer is released and a dicing tape is adhered to the back surface of the semiconductor wafer. The semiconductor wafer is then divided into individual chips by dicing, and each chip is pressed at the back surface thereof by way of the dicing tape, thereby releasing the chip from the dicing tape.

Further, according to another aspect of the invention, after reducing the thickness the back surface of a wafer, the wafer is forcibly oxidized or formed with an adhesion suppression layer, including formation of a silicon or acrylic base releasing agent layer on the back surface of the wafer. In this case, the strength upon separation can be optionally adjusted. On the other hand, compared with the use of an inorganic treating agent or treating solution, such as ozonized water, care should be taken for preventing contamination. However, a silicone type agent actually has been used generally so far in the field of semiconductors. Further, it can be used together with forcible oxidation. In this case, an advantage can be obtained in controlling the strength upon separation to an optimal value while keeping a state nearly equal with that of the existent spontaneous oxide layer.

Other aspects of the invention disclosed in the present application will be explained on the basis of the following method features.

1. A method of fabrication of a semiconductor integrated circuit device includes the steps of:
(a) forming a circuit pattern on a first main surface of a semiconductor wafer having a first thickness;
(b) adhering a first tape on the first main surface;
(c) grinding a second main surface of the semiconductor wafer to reduce the semiconductor wafer to a second thickness;
(d) forcibly oxidizing (also including simple oxidization here and hereinafter) the second main surface of the semiconductor wafer; and
(e) releasing the first tape that is adhered to the first main surface of the semiconductor wafer and adhering a second tape to the second main surface of the semiconductor wafer.

2. A fabrication method according to method 1 described above, wherein the step (c), the step (d) and the step (e) are conducted in a through process.

3. A fabrication method according to method 2 described above, wherein the second thickness of the semiconductor wafer is less than 100 μm.

4. A fabrication method according to method 2 described above, wherein the second thickness of the semiconductor wafer is less than 80 μm.

5. A fabrication method according to method 2 described above, wherein the second thickness of the semiconductor wafer is less than 60 μm.

6. A fabrication method according to method 1 described above, wherein the time during which the semiconductor wafer is left between the step (c) and the step (d) is within one min.

7. A fabrication method according to method 1 described above, wherein the time during which the semiconductor wafer is left between the step (c) and the step (d) is within 10 min.

8. A fabrication method according to method 1 described above, wherein the time during which the semiconductor wafer is left between the step (c) and the step (d) is within one hour.

9. A fabrication method according to method 1 described above, wherein the step (d) includes the sub-step of:
(d1) cleaning the semiconductor wafer with ozone-incorporated pure water (may also include a pure water solution containing a chemical solution or a chemical agent here and hereinafter) and forcibly oxidizing the second main surface of the semiconductor wafer.

10. A fabrication method according to method 1 described above, wherein the step (d) includes the sub-step of:
(d1) cleaning the semiconductor wafer with carbon dioxide-incorporated pure water and forcibly oxidizing the second main surface of the semiconductor wafer.

11. A fabrication method according to method 1 described above, wherein the step (d) includes the sub-step of:
(d1) pouring pure water and aqueous hydrogen peroxide onto the semiconductor wafer, thereby forcibly oxidizing the second main surface of the semiconductor wafer.

12. A fabrication method according to method 1 described above, wherein the step (d) includes the sub-step of:
(d1) coating an oxidizing agent to the second main surface of the semiconductor wafer or the surface of the second tape in contact with the semiconductor wafer and forcibly oxidizing the second main surface of the semiconductor wafer.

13. A fabrication method according to method 1 described above, wherein the step (d) includes the sub-step of:
(d1) blowing gaseous oxygen onto the second main surface of the semiconductor wafer thereby forcibly oxidizing the second main surface of the semiconductor wafer.

14. A fabrication method according to method 1 described above, wherein the step (d) includes the sub-step of:
(d1) blowing a hot blow onto the second main surface of the semiconductor wafer, thereby forcibly oxidizing the second main surface of the semiconductor wafer.

15. A fabrication method according to method 1 described above, wherein the step (d) includes the sub-step of:

(d1) placing the semiconductor wafer on a heated plate with the second main surface of the semiconductor wafer being in contact therewith, thereby forcibly oxidizing the second main surface of the semiconductor wafer.

16. A fabrication method according to method 1 described above further includes the steps of:
(f) dicing the semiconductor wafer (by rotary blade, laser, etc.) thereby dividing the semiconductor wafer into individual chips; and
(g) pressing each chip at the back surface by way of the second tape thereby releasing the chip from the second tape.

17. A fabrication method according to method 1 described above, wherein the processing of the semiconductor wafer is carried-out from the step (c) with a first main surface being adsorbed in a vacuum to a wafer transportation jig and then carried into the step (d) with the second main surface being adsorbed in a vacuum to a wafer transport jig.

18. A fabrication method according to method 1 described above, wherein the diameter of the semiconductor wafer is about 300 mm or more.

19. A fabrication method according to method 1 described above, wherein the first thickness of the semiconductor wafer is 700 μm or more.

20. A method of fabrication of a semiconductor integrated circuit device includes the steps of:
(a) forming a circuit pattern on a first main surface of a semiconductor wafer having a first thickness;
(b) bonding a first sheet or a plate-like member to the first main surface by a first pressure sensitive adhesive;
(c) grinding or etching the second main surface of the semiconductor wafer to reduce the semiconductor wafer to a second thickness;
(d) forcibly oxidizing the second main surface of the semiconductor wafer; and
(e) releasing or separating the first sheet or the plate-like member that is adhered to the first main surface of the semiconductor wafer, and bonding a second sheet or a plate-like member to the second main surface of the semiconductor wafer by a second pressure sensitive adhesive.

21. A method of fabrication of a semiconductor integrated circuit device includes the steps of:
(a) forming a circuit pattern on a first main surface of a semiconductor wafer having a first thickness;
(b) grinding (including etching) the second main surface of the semiconductor wafer thereby reducing the semiconductor wafer to a second thickness;
(c) removing the first layer (damage layer formed by grinding) formed on the second main surface of the semiconductor wafer (the step is not always necessary. A portion of the damage layer may be used as a trap layer, or the damage layer may be left entirely or partially);
(d) forming a second layer (impurity barrier layer, trap layer or adhesion control layer) on the second main surface of the semiconductor wafer; and
(e) dicing the semiconductor wafer, thereby dividing the semiconductor wafer into individual chips.

22. A fabrication method according to method 21 described above, wherein the thickness of the second layer is less than the thickness of the first layer.

23. A fabrication method according to methods 21 or 22 described above, wherein the second thickness of the semiconductor wafer is less than 100 μm.

24. A fabrication method according to methods 21 or 22 described above, wherein the second thickness of the semiconductor wafer is less than 80 μm.

25. A fabrication method according to methods 21 or 22 described above, wherein the second thickness of the semiconductor wafer is less than 60 μm.

26. A fabrication method according to any one of methods 21 to 25 described above, wherein the step (d) includes the sub-step of:
(d1) pouring ozone-incorporated pure water onto the semiconductor wafer, thereby forming an oxide layer on the second main surface of the semiconductor wafer.

27. A fabrication method according to any one of the methods 21 to 25 described above, wherein the step (d) includes the sub-step of:
(d1) pouring carbon dioxide-incorporated pure water onto the semiconductor wafer, thereby forming an oxide layer on the second main surface of the semiconductor wafer.

28. A fabrication method according to any one of the methods 21 to 25 described above, wherein the step (d) includes the sub-step of:
(d1) pouring hydrogen peroxide-incorporated pure water onto the semiconductor wafer, thereby forming an oxide layer to the second main surface of the semiconductor wafer.

29. A fabrication method according to any one of the methods 21 to 25 described above, wherein the step (d) includes the sub-step of:
(d1) pouring nitric acid onto the semiconductor wafer, thereby forming an oxide layer on the second main surface of the semiconductor wafer.

30. A fabrication method according to any one of the methods 21 to 25 described above, wherein the step (d) includes the sub-step of:
(d1) causing ions generated by plasma discharge to impact on the second main surface of the semiconductor wafer, cleaning the second main surface of the semiconductor wafer and forming a damage layer and an oxide layer therein.

31. A fabrication method according to any one of the methods 21 to 25 described above, wherein the step (d) includes the sub-step of:
(d1) jetting abrasive grains onto the second main surface of the semiconductor wafer, cleaning the second main surface of the semiconductor wafer and forming a pulverized layer thereon.

32. A fabrication method according to any one of the methods 21 to 25 described above, wherein the step (d) includes the sub-step of:
(d1) grinding the second main surface of the semiconductor wafer and forming a crystal defect layer on the second main surface of the semiconductor wafer.

33. A fabrication method according to any one of the methods 21 to 25 described above, wherein the step (d) includes the sub-step of:
(d1) ion implanting impurities to the semiconductor wafer, thereby forming a damage layer to the second main surface of the semiconductor wafer.

34. A fabrication method according to any one of the methods 21 to 25 described above, wherein the step (d) includes the sub-step of:
(d1) forming a oxide layer or a polycrystal silicon layer on the second main surface of the semiconductor wafer by plasma CVD.

35. A fabrication method according to any one of the methods 21 to 34 described above, wherein the step (c) includes the step of:
(c1) removing the first layer formed on the second main surface of the semiconductor wafer while leaving a portion thereof and retaining the first layer as the second layer in the step (d).

36. A method of fabrication of a semiconductor integrated circuit device including the steps of bonding a pressure sensitive adhesive tape to a circuit forming surface of a semiconductor wafer formed with a circuit pattern and grinding the back surface of the semiconductor to a predetermined thickness, then forcibly oxidizing the back surface of the semiconductor wafer and, subsequently, bonding a dicing tape to the back surface of the semiconductor wafer, releasing the pressure sensitive adhesive tape bonded to the circuit forming surface of the semiconductor wafer and dicing the semiconductor wafer into individual chips, pressing each chip at the back surface by way of the dicing tape and releasing the chip from the dicing tape.

37. A method of fabrication of a semiconductor integrated circuit device including the steps of reducing the thickness of a wafer, then forcibly oxidizing the back surface or forming a damage layer thereon to form a getter layer or barrier layer for preventing impurities from diffusing from the wafer back surface, thereby suppressing occurrence of characteristic failure of the device.

Among the features of the invention disclosed in the present application, the effects obtained by the invention will be described simply below.

That is, after reducing the thickness of the wafer, the back surface is forcibly oxidized or formed with an adhesion suppression layer thereby facilitating separation from the wafer retention member after dividing or substantially dividing the wafer into individual chips.

DETAILED DESCRIPTION OF PREFERRED EMBODIMENTS

Figure 1:
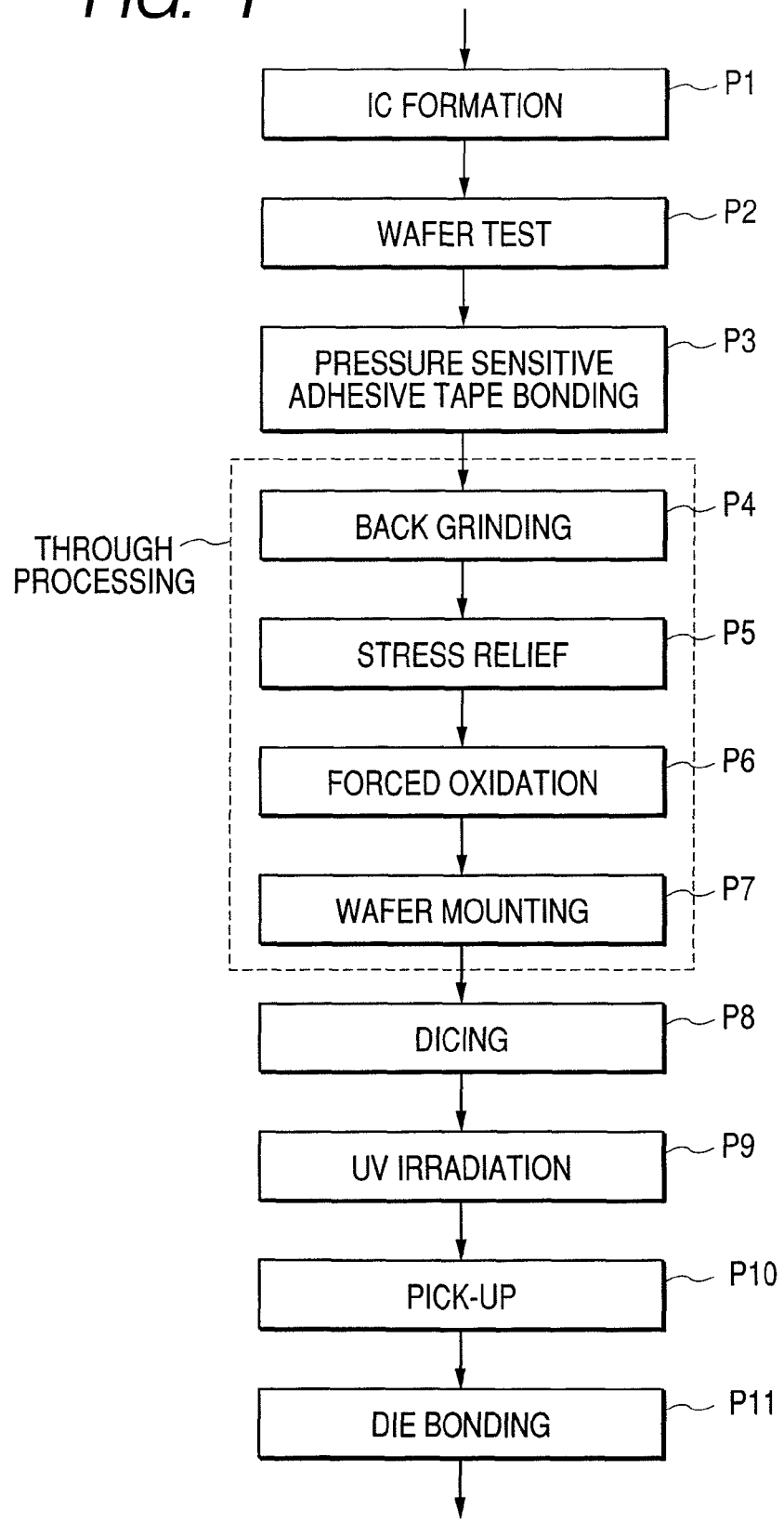
FIG. 1 is a process flow chart showing a method of fabrication of a semiconductor integrated circuit device representing a preferred embodiment of the invention.

Preferred embodiments of the invention will be described in detail with reference to the drawings. In the description of the preferred embodiments, the subject matter may be divided into plural sections or embodiments if this is necessary for the sake of convenience, but, unless otherwise specified, they are not irrelevant to each other, but are in such a relation that one represents a modified example, details or complementary description for one or entirety of the others. Further, in the following description of the embodiments, when a specific number of elements, etc (including the number of pieces, numerical values, amount, range, etc.) is mentioned, it should be understood that the invention is not restricted to the specified number unless otherwise clearly indicated, or apparently restricted in principle to a specified number, but may be more than or less than the specified number. Further, in the following description of the embodiments, it will be apparent that a constituent factor (also including an elemental step) is not always essential, unless otherwise specified or except in the case where it is apparently essential in principle. In the same manner, in the following description of the embodiments, when the shape and the positional relationship of the constitutional factors are mentioned, they also include those that are substantially similar with or homologous to the shape, etc., unless otherwise specified or when it may be considered apparently not so in principle. This is applicable also to the numerical value and the range discussed above. Further, throughout the drawings, those elements having identical functions will be identified by the same reference numerals, and a duplicate description thereof will be omitted. Further, in the drawings, even a plan view may sometimes be provided with hatching for making the elements of the drawing easy to see.

Further, the wafer referred to in the present application mainly comprises an Si (silicon) single crystal wafer but, it also may be an SOI (Silicon on Insulator) wafer or insulative film substrate for forming an integrated circuit thereon. The shape is not restricted to a circular or substantially circular shape, but also includes a square and rectangular shapes. Further, when gaseous, solid and liquid components are mentioned in this application, it comprises the ingredient described there as one of the main ingredients, but this does not exclude other ingredients, unless otherwise specified or when it should be apparently excluded in principle.

Embodiment 1

Figure 5:
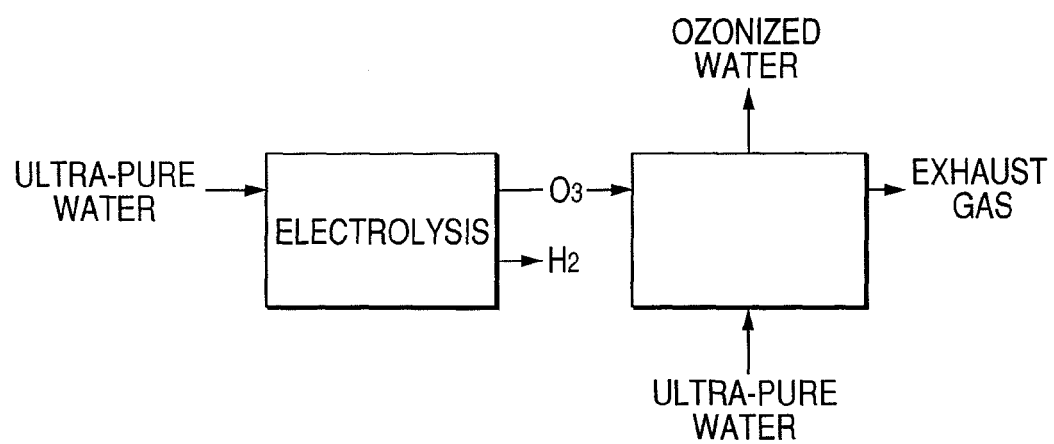
FIG. 5 is a diagram of an ozonized water generation device used in the fabrication of the semiconductor integrated circuit device as a preferred embodiment of the invention.
Figure 6:
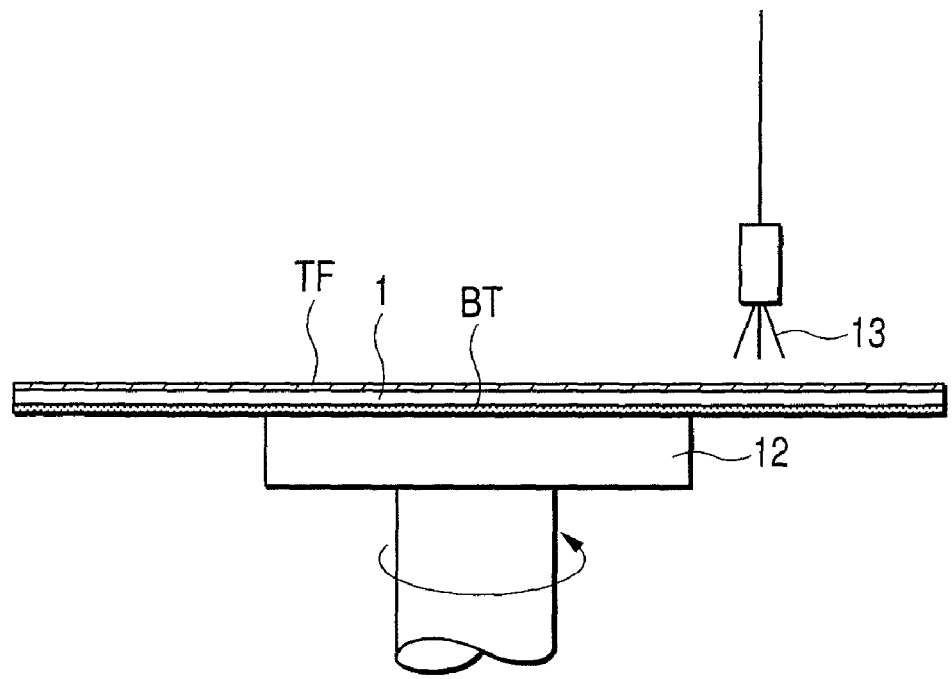
FIG. 6 is a diagrammatic side view showing a cleaning portion of back grinding used in the fabrication of the semiconductor integrated circuit device as a preferred embodiment according to the invention.
Figure 7:
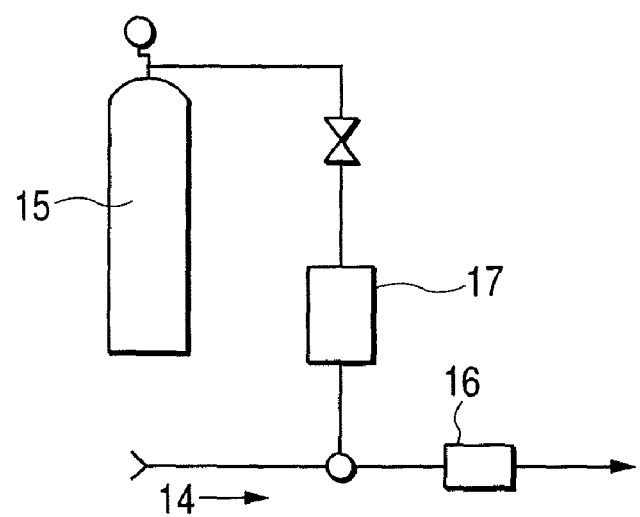
FIG. 7 is a schematic diagram showing a step of forming carbon dioxide-containing water in the fabrication of the semiconductor integrated circuit device as a preferred embodiment according to the invention.
Figure 8A:
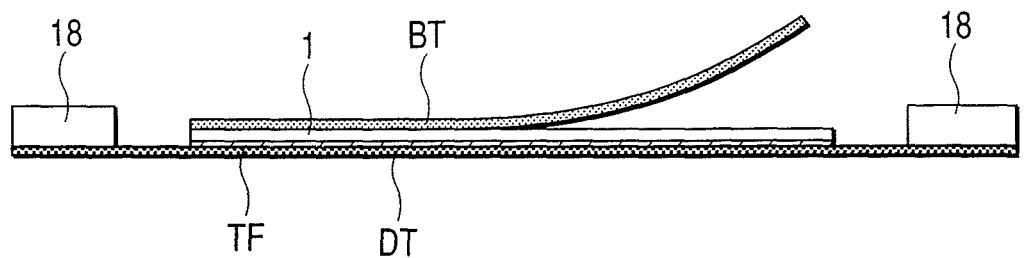
FIG. 8(a) is a side elevational view showing a main portion during a step in the fabrication of the semiconductor integrated circuit device succeeding the step of FIG. 4.
Figure 8B:
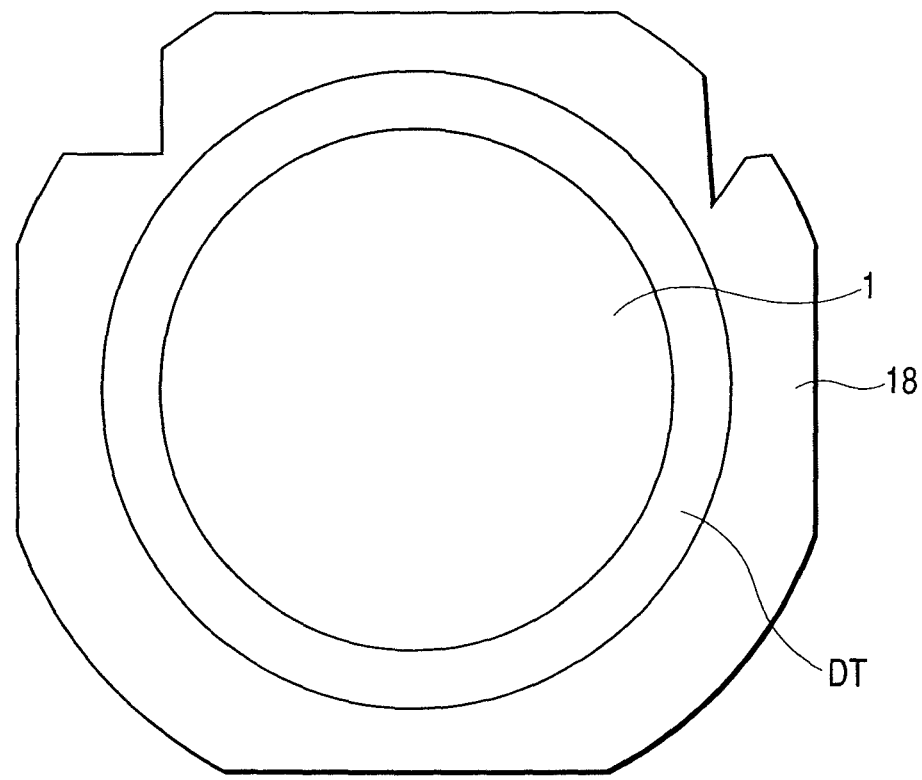
FIG. 8(b) is a plan view showing a main portion of the semiconductor integrated circuit device in the step identical to that shown FIG. 8(a)

A method of fabrication of a semiconductor integrated circuit device according to Embodiment 1 will be described in the order of the steps thereof with reference to FIG. 1 to FIG. 13. FIG. 1 is a process flow chart showing a method of fabrication of the semiconductor integrated circuit device, FIG. 2 to FIG. 4 and FIG. 8(a), and FIG. 9 to FIG. 12 are side elevational views showing a main portion of the semiconductor integrated circuit device, FIG. 8(b) is an upper plan view showing a main portion of the semiconductor integrated circuit device, FIG. 5 is a diagram showing an ozonized water generation device, FIG. 6 is a diagram showing a cleaning portion of back grinding, FIG. 7 is a diagram showing the step of forming carbon dioxide-incorporated water, and FIG. 13 is a diagram showing a through processing apparatus from back grinding to wafer mounting. In the following description, only each of the steps, from back grinding after forming a circuit pattern on a semiconductor wafer to die bonding of individualized chips on a substrate, are to be described in detail.

At first, an integrated circuit is formed on a circuit forming surface of a semiconductor wafer (first main surface) (step P1 in FIG. 1). The semiconductor substrate wafer comprises silicon single crystals, and the diameter thereof is, for example, 300 mm and the thickness (first thickness) is, for example, 700 µm or more.

Then, it is judged whether each of the chips prepared on the semiconductor wafer is intact or defective (step P2 in FIG. 1). For this purpose, the semiconductor wafer is placed on a measuring stage, a probe is brought into contact with an electrode pad of an integrated circuit, and, when a signal waveform is inputted from an input terminal, a signal waveform is outputted from an output terminal. By reading the waveform using a tester, a chip is judged to determine whether it is intact or defective. In this case, a probe card in which probes are arranged corresponding to all electrode pads of the integrated circuit is used. Signal lines corresponding to each of the probes corresponding to each of the grooves is led out from the probe card and connected to the tester. A chip that is judged to be defective is indented with a defective mark.

Then, a pressure sensitive adhesive tape (first tape) is bonded to a circuit forming surface of the semiconductor wafer (step P3 in FIG. 1). The pressure sensitive adhesive tape may be a self-releasable tape, that is, a UV-cured type or thermosetting type or EB cured type tape. Further, it may be a non-UV-cured type of pressure sensitive adhesive tape, that is, it may be that a usual pressure sensitive adhesive tape (not a self releasable tape), which is not a thermosetting type, UV cured type or EB cured type. In the case of the non-self releasable tape, while self-releasability is not available, there are the advantages of avoiding a change of information written to a memory circuit, such as a non-volatile memory, a shift of characteristics or an undesirable change of the surface characteristics of a surface protective member, such as one made of a polyimide layer or a re-wiring insulative material, that are generated in a case of irradiating UV-rays (energy ray irradiation or heating) to a wafer device surface.

The following description will be directed to an example using a UV-ray cured tape. A UV-curable pressure sensitive adhesive is coated on a pressure sensitive adhesive tape by which the pressure sensitive adhesive tape is bonded with a circuit forming surface of a semiconductor wafer. The pressure sensitive adhesive tape is formed, for example, of a polyurethane film serving as a substrate, to which an acrylic UV-cured type adhesive is coated and on which a releasing material formed of polyester is further applied. The releasing member is, for example, releasing paper and the pressure sensitive adhesive tape is bonded to the semiconductor wafer after releasing the releasing member. The thickness of the pressure sensitive adhesive tape is, for example, 180 µm and the adhesion is, for example, from 200 to 400 g/25 mm before UV-irradiation and from 20 to 30 g/25 mm after UV-irradiation. A pressure sensitive adhesive tape with no releasing member, but which is subjected to a releasing treatment at the back thereof, may also be used.

Figure 2:
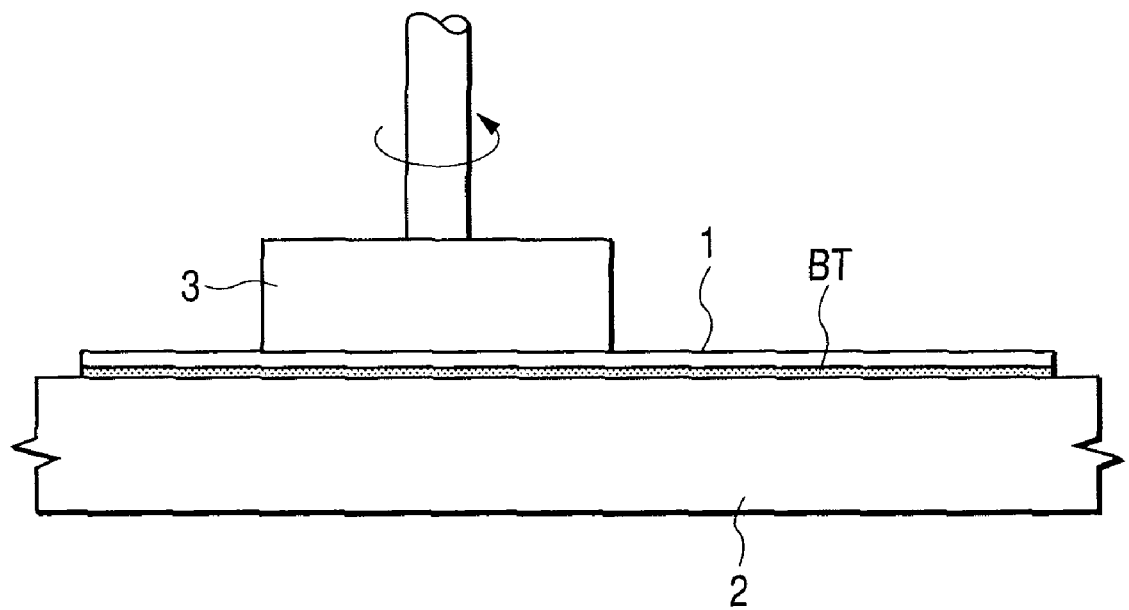
FIG. 2 is a side elevational view showing a main portion during a step in the manufacture of the semiconductor integrated circuit device representing a preferred embodiment of the invention.

Then, as shown in FIG. 2, the back surface of a semiconductor wafer 1 (surface opposite to the circuit forming surface; second main surface or second surface) is roughly ground to reduce the thickness of the semiconductor wafer 1 to less than 100 µm, less than 80 µm or less 60 µm (step P4 in FIG. 1). From the step P4 (back grind) to the step P7 (wafer mounting) to be described later, transportation and treatment for the semiconductor wafer 1 are carried out always in a state where it is vacuum-adsorbed in order to prevent the semiconductor wafer 1 from warping; and, for example, continuous treatment is applied by a through processing apparatus to be described later. The semiconductor wafer 1 is transported to a grinder device; and, after vacuum-adsorbing the circuit forming surface of the semiconductor wafer 1 to a chuck table 2, a rotating grinding member (for example, of #360 roughness [number of protrusions: about 360 N per unit area]) 3 is urged to the back surface of the semiconductor wafer 1 to apply rough grinding thereto so as to reduce the thickness of the semiconductor wafer 1 to a predetermined thickness (second thickness). Since the pressure sensitive adhesive tape BT is bonded to the circuit forming surface of the semiconductor wafer 1, the integrated circuit is not destroyed.

Then, the back surface of the semiconductor wafer 1 is subjected to finish grinding. In this case, after vacuum-adsorbing the circuit forming surface of the semiconductor wafer 1 to the chuck table using the same grinder device as shown in FIG. 2, a rotating grinding member (for example, #1500 or #2000 roughness) is urged to the back surface of the semiconductor wafer 1 to apply finish grinding, by which strains at the back surface of the semiconductor wafer 1 caused during rough grinding can be removed and the strength of the chip can be improved.

Then, grinding streaks produced on the back surface of the semiconductor wafer 1 by back grinding are removed (step P5 in FIG. 1). The back surface of the semiconductor wafer 1, with the circuit forming surface thereof being vacuum-adsorbed to the chuck table 2 of the grinder device, is vacuum-adsorbed by a wafer transportation jig, the vacuum of the chuck table 2 is broken and the semiconductor wafer 1 is held by the wafer transportation jig and the semiconductor wafer 1 is transported as it is to a stress relief device. Further, the semiconductor wafer 1, after being vacuum-adsorbed at the circuit forming surface thereof to the rotary table or pressing head of the stress relief device, is subjected to stress relief. The grinding streak comprises an amorphous layer/polycrystal layer/microcrack layer/strain layer (stress transfer layer)/complete crystal layer, and the amorphous layer/polycrystal layer/microcrack layer are removed by the stress relief.

Figure 3A:
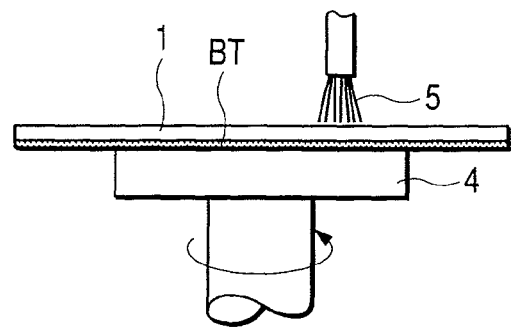
FIG. 3(a), FIG. 3(b) and FIG. 3(c) are, respectively, diagrammatic side views of an apparatus illustrating stress relief by a spin etching method, a CMP method and a dry polishing method, each as a preferred embodiment of the invention.
Figure 3B:
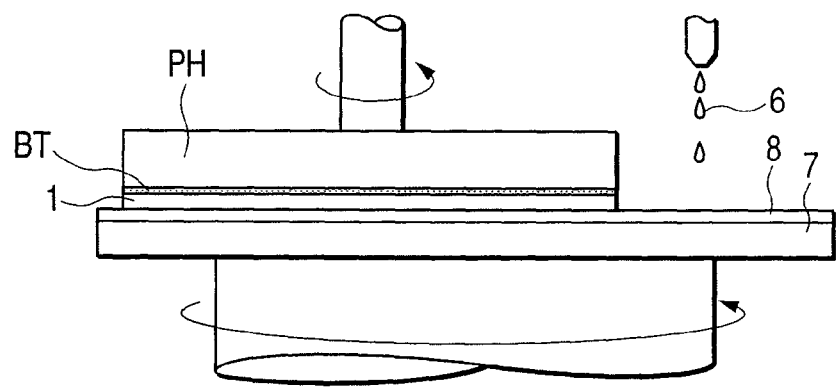
Figure 3C:
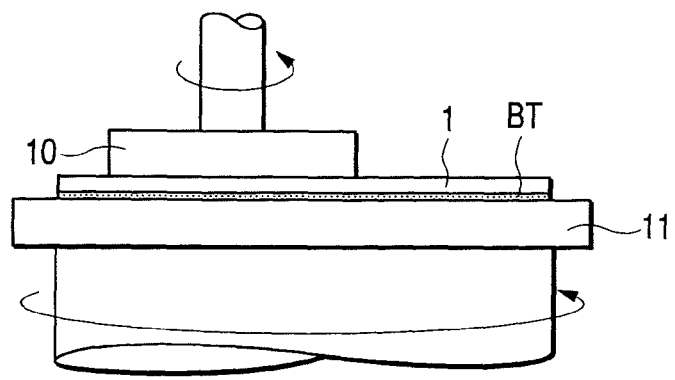

In the stress relief, a spin etch method (FIG. 3(*a*)), CMP (Chemical Mechanical Polishing) method (FIG. 3(*b*)) or a dry polishing method (FIG. 3(*c*)) is used. The spin etch method is an etching method in which fluoro nitric acid 5 is applied while a semiconductor wafer 1 is supported on a rotary table 4. While this method has an advantage in that it is capable of removing a large amount, it involves a problem in that disposal of waste gas or waste liquid is difficult, and it takes a substantial cost for the treatment thereof. The CMP method is a method in which a semiconductor wafer 1 is retained by a pressing head PH, and polishing the wafer is polished while press fitting the back surface of the semiconductor wafer 1 to a grinding pad 8 appended to the surface of a platen 7, during which a slurry (grinding abrasion liquid) 6 flows. This method can provide a uniform fabrication surface; however, since there is an increased cost of material or installation cost, such as for provision of the slurry 6, the overall cost is increased compared with other methods. Further, while the dry polishing method can reduce the cost compared with other methods, since the back surface of the semiconductor wafer 1 placed on a rotary table 11 is polished by a polishing cloth to which abrasive grains adhere (cloth deposited with a silica at the surface of fibers by a binder and hardened into a pad-like shape, for example, of about 400 mmφ and 26 mm thickness) 10, a force is exerted on the semiconductor wafer 1 tending to chip the periphery of the semiconductor wafer 1. It is not necessary that stress relief is applied to all of the semiconductor wafers 1, but it is applied in accordance with the strength required for the chip.

Figure 4:
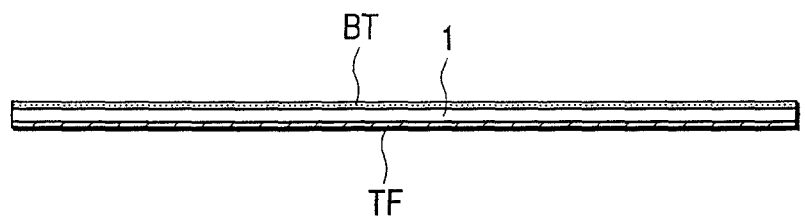
FIG. 4 is a side elevational view showing a main portion during a step in the fabrication of the semiconductor integrated circuit device succeeding the step of FIG. 2.

Then, as shown in FIG. 4, the back surface of the semiconductor wafer 1 is forcibly oxidized to form an oxide layer TF with a thickness of 1 nm or less (step P6 in FIG. 1). The time the semiconductor wafer is held between the back grinding (step P4 in FIG. 1) or stress relief (step P5 in FIG. 1) to the forcible oxidation is within one min, 10 min or one hour. The semiconductor wafer 1, which is vacuum-adsorbed to the rotary table or a pressing head of the stress relief device, is vacuum-adsorbed by a wafer transportation jig, and then vacuum for the rotary table or the pressing head is broken, thereby retaining the semiconductor wafer 1 using the wafer transportation jig. Then, the semiconductor wafer 1 is transported as it is to an oxidation device. Further, the semiconductor wafer 1 is vacuum-adsorbed to the chuck table of the oxidation device and then subjected to oxidation treatment.

At this time, the grinding or stress relief is completed, and the semiconductor wafer 1 is reduced in thickness, which could cause warping. However, since it is secured by way of the pressure sensitive adhesive tape BT and vacuum-adsorbed by the chuck table 2, the rotary tables 4, 11, the pressing head PH or the wafer transportation jig, warping of the semiconductor 1 does not occur. However, at the instance when the back grinding or stress relief is completed, the back surface (silicon surface) of the semiconductor wafer 1 is activated, and when the semiconductor wafer 1 is mounted on a dicing tape in this state, the glue of the dicing tape and the back surface of the semiconductor wafer are joined making it impossible to release the chip from the dicing tape. Thus, an oxide layer TF is formed by forcible oxidation of the back surface of the semiconductor wafer 1 to inactivate the silicon surface and make the dicing tape tend to release from the chip.

Forcible oxidation of the back surface of the semiconductor wafer 1 is carried out, for example, by any of the following first to seven methods. In the first method, cleaning water formed by incorporating ozone ($O_3$) into pure water ($H_2O$) is used when cleaning the back surface of the semiconductor wafer 1 after completion of back grinding or stress relief. The cleaning water is formed by an ozonized water generation device, such as shown in FIG. 5. At first, after electrolyzing ultra-pure water to generate an ozone gas, the ozone gas is dissolved in ultra-pure water to form ozonized water. Successively, as shown in FIG. 6, ozonized water 13 is poured onto the back surface of the semiconductor wafer 1 for about 10 sec, such that ozonized water covers the entire back surface of the semiconductor wafer 1, which is placed on a rotary table 12. It is considered that the temperature of the semiconductor wafer is a normal temperature and the appropriate range for the concentration of ozonized water 13 is, for example, from 0.1 to 20 ppm (the range is not restrictive, but may vary depending on the condition). Further, a range suitable to mass production is considered to be from 0.3 to 8 ppm, and, further, it is considered that a range around 1 to 2 ppm, such as from 0.6 to 4 ppm, is most suitable. Since the first method can conduct oxidation simultaneously with the cleaning of the back surface of the semiconductor wafer 1, it can avoid an increase in the number of steps. Further, the first method requires less running cost and clean oxidation can be carried out because of the use of ozonized water 13, with no impurities being formed by dissolving the ozone gas into the ultra-pure water, but it requires a high installation cost.

In the second method, cleaning water formed by incorporating carbon dioxide ($CO_2$) into pure water is used when cleaning the back surface of the semiconductor wafer 1, after completion of back grinding or stress relief. It is considered that an appropriate range of concentration of $CO_2$ dissolved in pure water is, for example, from 1 to 1000 ppm (the range is not restrictive, but may vary depending on the condition). Further, a range suitable to mass production is considered to be from 10 to 500 ppm, and, further, it is considered that a range around 100 to 200 ppm, such as from 80 to 300 ppm, is most suitable. The cleaning water is formed by a $CO_2$-incorporated water forming step, such as shown FIG. 7. $CO_2$-incorporated water is formed by pouring a $CO_2$ gas in a predetermined amount from a $CO_2$ gas reservoir 15 into ultrapure water 14. A densitometer 16 is interposed in the supply line for the $CO_2$-incorporated water and the flow rate of the $CO_2$ gas can be indicated to a mass flow controller by monitoring the $CO_2$ concentration. The second method has already been adopted in the fabrication of semiconductor integrated circuit devices and can be introduced easily to achieve oxidation of the back surface of the semiconductor wafer 1. Further, while the second method requires a high installation cost, like the first method described above, the running cost is inexpensive and clean oxidation can be carried out.

In the third method, aqueous hydrogen peroxide ($H_2O_2$) is poured on the surface together with pure water, when cleaning the back surface of the semiconductor wafer 1, after completion of back grinding or stress relief. While the third method requires a high installation cost, it can produce clean oxidation like the first method.

In the fourth method, an oxidant (releasing agent) is coated to the back surface of the semiconductor wafer 1 or the surface of a dicing tape. While contamination with the oxidant may be a concern in the fourth method, it can reduce the running cost and the installation cost.

In the fifth method, gaseous oxygen ($O_2$) is blown to the back surface of the semiconductor wafer 1, in the stand-by period of the semiconductor wafer 1, after completion of back grinding or stress relief. In this case, it may be heated to a temperature, for example, at about 100° C. In the sixth method, a hot blow is applied by applying, for example, a hot jet to the back surface of the semiconductor wafer 1. In the seventh method, the semiconductor wafer 1 is placed on a hot plate with the back surface in contact therewith. The fifth, sixth and seventh methods can reduce the running cost and the installation cost.

Then, as shown in FIG. 8, the semiconductor wafer 1 is transferred and adhered to a dicing tape (second tape) DT without delay (step P7 in FIG. 1). After the completion of forcible oxidation, the semiconductor wafer 1 is vacuum-adsorbed by a wafer transport jig and transported as it is to a mounting device. The semiconductor wafer 1 transported to the mounting device is at first sent to an alignment station for alignment by use of a notch or orientation flat and then the semiconductor wafer 1 is sent to a wafer mounting station for conducting wafer mounting. In the wafer mounting, a circular frame 18 is provided, to which a dicing tape DT has been previously adhered, and the semiconductor wafer 1 is adhered to the dicing tape DT with the circuit forming surface facing upward. In this case, the back surface of the semiconductor wafer 1 is formed with an oxide layer TF produced by forcible oxidation, and the back surface, in a deactivated state, is carried to adhere in contact with the dicing tape DT. The dicing tape DT comprises, for example, a polyolefin substrate, on which an acrylic UV cured type adhesive is coated, and a releasing material made of polyester is also adhered thereon. The releasing material is, for example, releasing paper, and the pressure sensitive adhesive tape is adhered to the semiconductor wafer 1 after peeling the releasing material. The dicing tape DT has a thickness, for example, of 90 µm and an adhesion strength, for example, of 200 g/25 mm before UV-irradiation and from 10 to 20 g/25 mm after UV irradiation. A pressure sensitive adhesive tape having no releasing material, but which has been subjected to a releasing treatment at the back of the substrate, may also be used.

By the way, the back surface of the semiconductor wafer 1 changes from the activated state to the deactivated state in about several hours. Accordingly, since a semiconductor wafer having a thickness of 100 µm or more or 200 µm or more causes less warp even after a delay in processing, the back surface of the semiconductor wafer may be changed to the deactivated state by the formation of a spontaneous oxide layer after the completion of back grounding or stress relief even after 4 hours or more. In this case, forcible oxidation of the back surface of the semiconductor wafer may be saved. However, since the semiconductor wafer has to be left until a spontaneous oxide layer is formed, this requires a wasteful time. Then, it is possible also, for semiconductor wafers having a thickness of 100 µm or more or 200 µm or more, to forcibly oxidize the back surface into a deactivated state and adhere the dicing tape DT without a delay in processing.

Then, the frame 18 with the semiconductor wafer 1 is sent to a pressure sensitive tape releasing station. In this station, UV-rays are irradiated to the adhesive that causes the semiconductor wafer 1 to adhere to the pressure sensitive tape BT so as to lower the adhesion, for example, to about 20 to 30 g/25 mm, and then the pressure sensitive tape BT is released. The semiconductor wafer 1 is transferred and adhered again to the frame 18, because it is necessary to use the circuit forming surface having alignment marks as the upper surface, since dicing is conducted in the subsequent dicing step with reference to the alignment mark formed on the circuit forming surface of the semiconductor wafer 1 as a reference. Even when the pressure sensitive adhesive tape BT is released, since the semiconductor wafer 1 is secured by way of the dicing tape DT to the frame 18, warping in the semiconductor wafer 1 does not occur.

Figure 9:
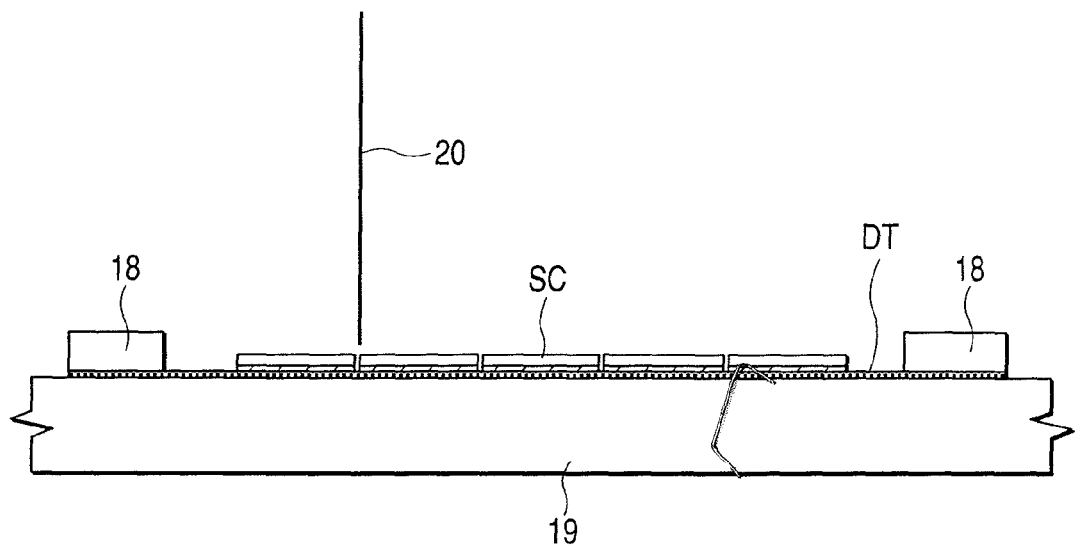
FIG. 9 is a side elevational view showing a main portion during a step in the fabrication of the semiconductor integrated circuit device succeeding the step of FIG. 8.

Then, as shown in FIG. 9, the semiconductor wafer 1 is subjected to dicing (step P8 in FIG. 1). While the semiconductor wafer 1 is divided into individual chips SC, since the respective chips SC are secured by way of the dicing tape DT to the frame 18 after being divided individually, they are maintained in an arranged state. At first, the semiconductor wafer 1 is vacuum-adsorbed by a wafer transportation jig at the circuit forming surface of the semiconductor wafer 1, transported as it is to the dicing device and placed on a dicing table 19. Successively, the semiconductor wafer 1 is cut longitudinally and laterally along scribe lines by using an extremely thin circular blade 20 that is bonded with fine diamond grains, which is referred to as a diamond saw.

Figure 10:
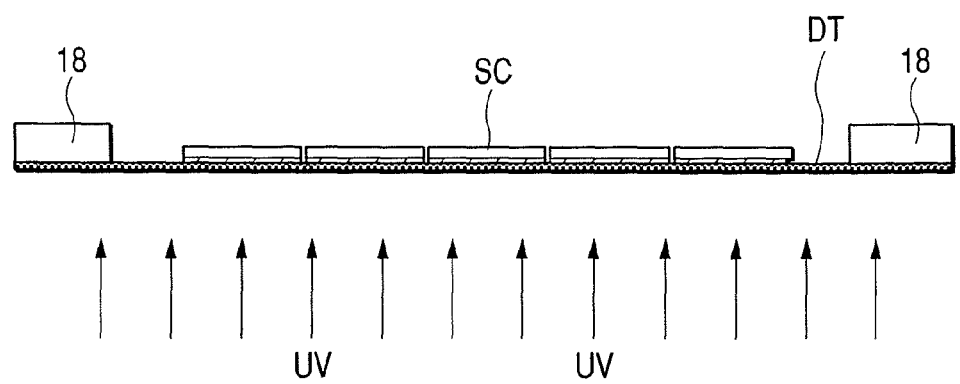
FIG. 10 is a side elevational view showing a main portion during a step in the fabrication of the semiconductor integrated circuit device succeeding the step of FIG. 9.

Then, as shown in FIG. 10, UV-rays are irradiated to the semiconductor wafer 1 (step P9 in FIG. 1). At first, UV-rays are irradiated from the back of the dicing tape DT to lower the adhesion of the dicing tape DT at the surface in contact with each chip SC, for example, to about 10 to 20 g/25 mm. Each of the chips thus tends to be released easily from the dicing tape DT.

Figure 11:
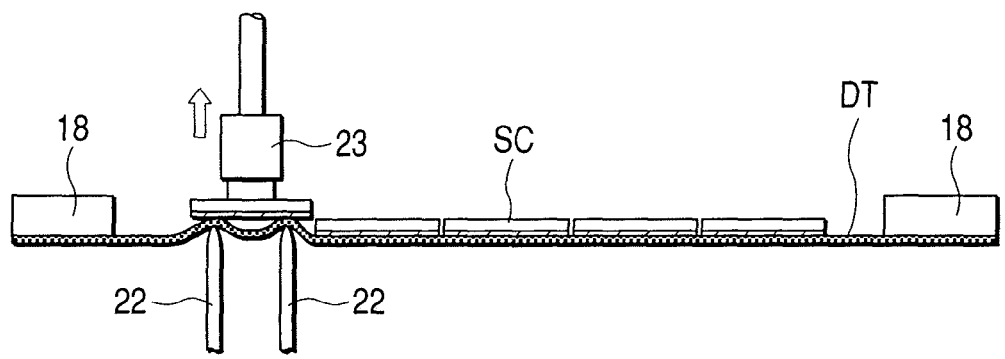
FIG. 11 is a side elevational view showing a main portion during a step in the fabrication of the semiconductor integrated circuit device succeeding the step of FIG. 10.

Then, as shown in FIG. 11, a chip SC, which has been judged intact in the step P2, is picked-up (step P10 in FIG. 1). At first, the back surface of the chip SC is pressed by a push pin 22 by way of the dicing tape DT to release the chip SC from the dicing tape DT. Successively, a collet 23 moves to a position above and opposed to the push-up pin 22, the circuit forming surface of the released chip SC is vacuum-adsorbed by the collet 23, and the chips SC are released and picked-up from the dicing tape DT one by one. Since adhesion between the dicing tape DT and the chip SC is weakened by UV-irradiation, and the back surface of the chip SC is deactivated by the formation of the oxide layer TF, even a thin chip SC of reduced strength can be picked-up reliably. The collet 23 has, for example, a substantially cylindrical outer profile and an adsorption portion situated at the bottom is formed, for example, of soft synthetic rubber.

Figure 12:
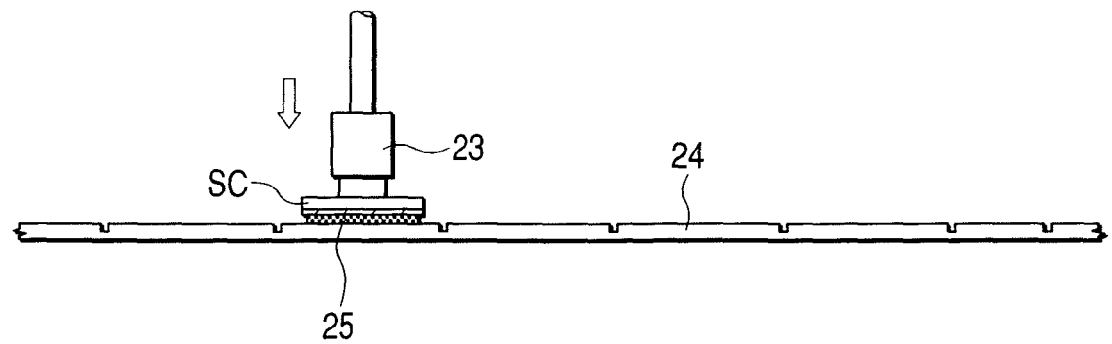
FIG. 12 is a side elevational view showing a main portion during a step in the fabrication of the semiconductor integrated circuit device succeeding the step of FIG. 11.
Figure 13:
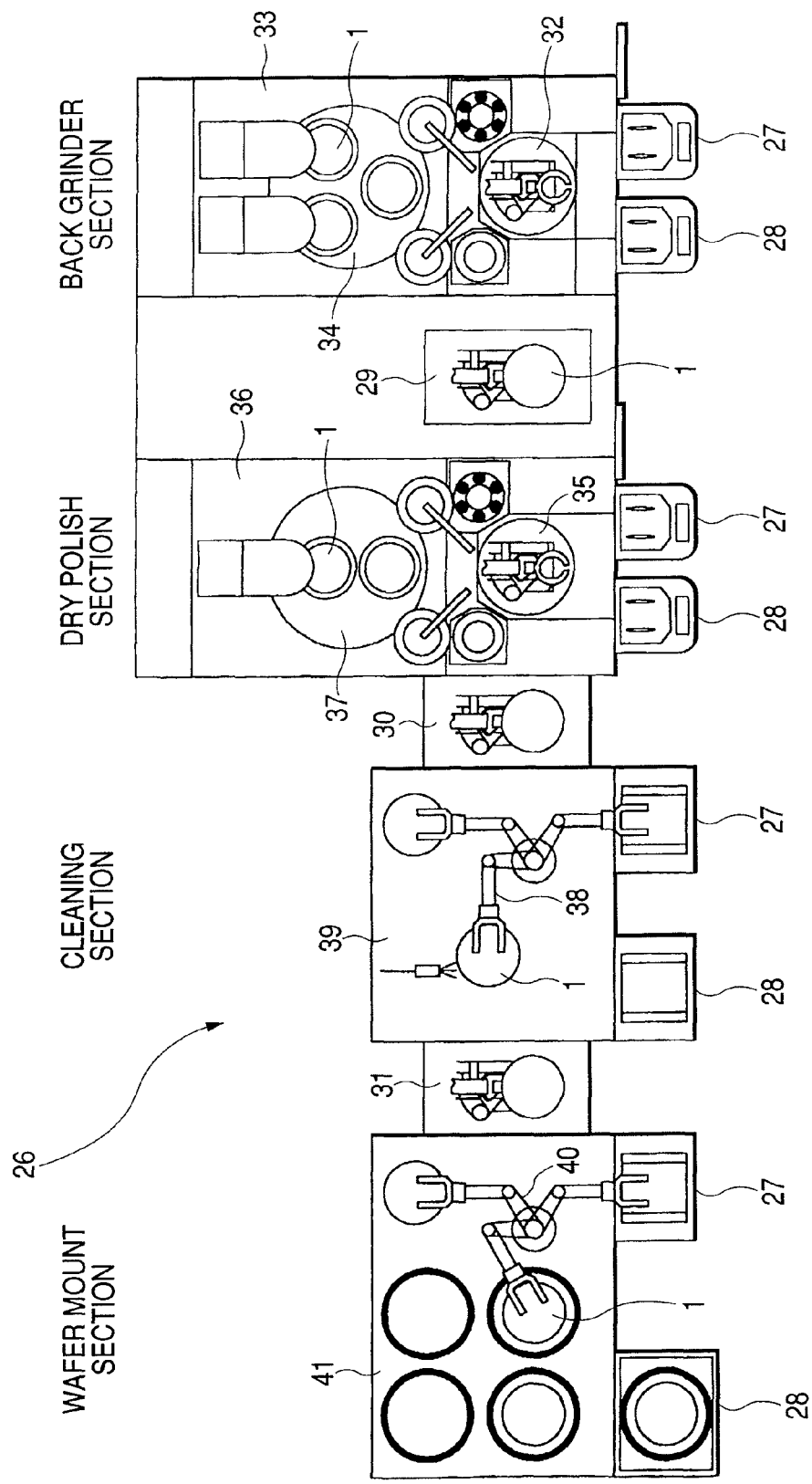
FIG. 13 is a diagram showing a through processing apparatus, from back grinding to wafer mounting, for use in the fabrication of a semiconductor integrated circuit device representing a preferred embodiment according to the invention.

Then, the chip SC is mounted on a substrate 24 (step P11 in FIG. 1), as shown in FIG. 12. The picked-up chip SC adhere to and is retained by the collet and transported to a predetermined position on the substrate 24. Successively, a paste material 25 is placed on a plated island of the substrate 24, to which the chip SC is pressed lightly and subjected to a hardening treatment at a temperature of about 100 to 200° C. Thus, the chip SC is bonded to the substrate 24. The paste material 25 can include, for example, epoxy resin, polyimide resin, acrylic resin or silicone resin. Further, in addition to adhesion with the paste material 25, it may be adhered by slightly rubbing the back surface of the chip SC to the plated island, or a small piece of gold tape may be interposed between the plated island and the chip SC to prepare eutectic crystals of gold and silicon.

After completing the die bonding of intact chips adhered to the dicing tape DT and removal of failed chips, the dicing tape DT is released from the frame 18 and the frame 18 is recycled.

Then, electrodes on the chip SC and electrodes on the substrate 24 are connected electrically, and, further, the chip SC is sealed with a mold resin and protected. Successively, a product name or the like is stamped on the mold resin, and individual chips are divided from the substrate 24. Then, the finished chips SC are selected in accordance with standards for products, and the products are completed by way of an inspection step.

As described above, according to Embodiment 1, even when the back surface of the semiconductor wafer 1 is activated by back grinding or stress relief, since the oxide layer TF is formed on the back surface of the semiconductor wafer 1 by forcible oxidation to provide a deactivated state, the chip SC can be stably released from the dicing tape DT upon picking-up the chip SC from the dicing tape DT. Since this can release the chips SC stably and holding failure for the chip SC by the collet 23 is suppressed, it is possible to prevent a lowering of the production yield for athe semiconductor products due to holding failure of the chips SC by the collet 23. Further, by forming the oxide layer TF on the back surface of the semiconductor wafer 1 after completion of back grinding or stress relief, since the semiconductor wafer 1 can be adhered to the dicing tape DT without delay, the TAT can be shortened.

Now, an example of continuous processing from back grinding (step P4 in FIG. 1) to wafer mounting (step P7 in FIG. 1) will be described with reference to a through processing apparatus shown in FIG. 13.

A through processing apparatus 26 comprises a back grinder station, a dry polishing station, a cleaning station and a wafer mounting station. Each of the stations is provided with a loader 27 for carrying-in the semiconductor wafer 1, and an unloader 28 for carrying-out the wafer 1, and each of the stations can also be used while standing alone. Further, a transportation robot 29 is provided between the back grinder station and the dry polishing station for transporting the semiconductor wafer 1 between them. In the same manner, a transportation robot 30 is provided between the dry polishing station and the cleaning station and a transportation robot 31 is provided between the cleaning station and the wafer mounting station for transporting the semiconductor wafer between the stations, respectively.

At first, after placing a FOUP (Front Open Unified Pod) mounting plural semiconductor wafers 1 on a loader 27 in the back grinder station, a single semiconductor wafer 1 is taken out by the transportation robot 32 from the FOUP and carried into a processing chamber 33 in the back grinder station. The FOUP is a tightly closed container for batch transportation of semiconductor wafers and contains semiconductor wafers, usually, in a unit of 25, 12, or 6 sheets, etc. The container outer wall of the FOUP has an air tight structure except for a fine ventilation filter portion, and dust is excluded substantially completely. Accordingly, even when they are transported in a class 1000 atmosphere, the inside can be kept at class 1 cleanliness. Docking with the apparatus is conducted in a state capable of maintaining the required cleanness by the drawing of FOUP's door to the inside by the robot on the side of the apparatus. Successively, after placing the semiconductor wafer 1 on the chuck table 34 and after vacuum-adsorption, the back surface of the semiconductor wafer 1 is ground to reduce the thickness of the semiconductor wafer 1 to a predetermined thickness.

Then, after the completion of back grinding for the semiconductor wafer 1, the semiconductor wafer 1 is carried-out by a transportation robot 29 from the back grinder station and carried-into the dry polishing station. Further, the semiconductor wafer 1 is carried in by a transportation robot 35 into a processing chamber 36 in the dried polishing station. After placing the semiconductor wafer 1 on a chuck table 37 under vacuum adsorption, the back surface of the semiconductor wafer 1 is flattened.

Then, after the completion of dry polishing for the semiconductor wafer 1, the semiconductor wafer 1 is carried-out by the transportation robot 30 from the dry polishing station and transported to the cleaning station. Further, the semiconductor wafer 1 is carried-in by a transportation robot 38 into a processing chamber 39 of the cleaning apparatus. The processing chamber 39 has a constitution, for example, as shown in FIG. 6, in which clean water formed by incorporating ozone into pure water is poured onto the back surface of the semiconductor wafer 1. This applies cleaning to the semiconductor wafer 1 and forcible oxidation of the back surface of the semiconductor wafer 1 simultaneously.

Then, after the completion of the cleaning of the semiconductor wafer 1, the semiconductor wafer 1 is carried-out by the transportation robot 31 from the cleaning station and transported to the wafer mounting station. After vacuum-adsorbing the back surface of the semiconductor wafer 1 by a transportation robot 40, the vacuum adsorption surface of the semiconductor wafer 1 is exchanged and the circuit forming surface is vacuum-adsorbed. Successively, the semiconductor wafer 1 is carried into the processing chamber 41 in the wafer mounting station. In this station, after adhering the semiconductor wafer 1, with the circuit forming surface facing upwarded, to a dicing tape secured to a circular frame, the semiconductor wafer 1 is adhered with the circuit forming surface facing upwarded, to the dicing tape, and then the pressure sensitive adhesive tape is released. Then, the semiconductor wafer 1 is transported to the unloader 28 for the wafer mounting station and the semiconductor wafer 1 is taken out from the wafer mounting station and returned to the FOUP.

As described above, the semiconductor wafer is processed in a short time from the back grinding to the wafer mounting by using the through processing apparatus 26; and, since the back surface of the semiconductor wafer 1 is forcibly oxidized into a deactivated state, the chip can be picked-up stably in the die bonding process after the successive dicing.

Embodiment 2

In response to a demand for reducing the thickness of the chip, the semiconductor wafer is ground in back grinding to a thickness, for example, of less than 100 μm. The back surface of the ground semiconductor wafer comprises an amorphous layer/polycrystal layer/micro-crack layer/atom level strain layer (stress transfer layer)/complete crystal layer, in which the amorphous layer/polycrystal layer/micro-crack layer are crystal defective layers. The thickness of the crystal defective layer is, for example, about 1 to 2 μm.

In the case where a crystal defective layer is present on the back surface of the semiconductor wafer, this results in a problem in that there is a lowering of the flexion strength (stress value when the chip is destroyed upon application of a simple bending stress to the chip) of the chip divided from the semiconductor wafer into individual pieces. Lowering of the flexion strength appears remarkably in a chip with a thickness of less than 100 μm. Thus, stress relief is applied following back grinding to remove the crystal defect layer and make the back surface of the semiconductor wafer as a mirror surface, thereby preventing a lowering of the flexion strength of the chip. For stress relief, a dry polishing method, a CMP method or a chemical etching method is used, for instance.

By the way, when the crystal defect layer at the back surface of the semiconductor wafer 1 is removed, contamination impurities deposited to the back surface of the semiconductor wafer, for example, heavy metal impurities, such as copper (Cu), iron (Fe), nickel (Ni) or chromium (Cr), easily invade the semiconductor wafer. Such contamination impurities intrude in all semiconductor fabrication apparatus, such as gas pipelines or heater lines, and a process gas can also be a contamination source for contamination impurities. Contamination impurities invading the back surface of the semiconductor wafer further diffuse in the semiconductor wafer and are attracted to crystal defects near the circuit forming surface. The contamination impurities which have diffused as far as the vicinity of the circuit forming surface form a carrier trapping level, for example, in the forbidden band. Further, contamination impurities that have solid solubilized to silicon oxide/silicon boundaries increase, for example, the boundary level. As a result, characteristic failure of a semiconductor device caused by the contamination impurities causes a lowering of the production yield of the semiconductor product. For example, in a flash memory operating as a non-volatile semiconductor memory, failure sectors increase upon erasing/writing caused by contamination impurities, thereby to generate a characteristic failure, since the number of remedy sectors is insufficient. Further, in the usual DRAM (Dynamic Random Access Memory) and pseudo SRAM, leakage type failures, such as degradation of the refresh characteristics or self refresh characteristics are caused due to contamination impurities. In the flash type memory, they cause a data retention failure. That is, while the flexion strength of the wafer or chip of reduced thickness can be improved by stress relief after back grinding, since the pulverization layer is removed or a barrier is not formed to the back surface of the wafer in the stress relief by dry polishing or polishing by CMP or the like, the gettering effect against the invasion of the contamination impurities from the back surface of the wafer is lowered. When diffusion of the contamination impurities proceeds near the device surface, the device characteristics fluctuate to sometime cause an operation failure.

When the crystal defect layer is left on the back surface of the semiconductor wafer, while the crystal defect layer can prevent intrusion of the contamination impurities deposited to the back surface of the semiconductor wafer, this can not prevent a lowering of the flexion strength of the chip.

One object of the invention disclosed in this application is to provide a technique which is capable of suppressing a lowering of the production yield of semiconductor products attributable to the presence of a contamination impurity.

Another object of the invention disclosed in this application is to provide a technique which is capable of removing contamination impurities that have invaded from the back surface of the wafer by cleaning the back surface of the wafer of reduced thickness, or by forming an oxide layer on the back surface of the wafer as a barrier against diffusion of the contamination impurities, or by forming a damage layer to improve the gettering effect, thereby improving the yield of the semiconductor products and shortening the TAT.

Figure 14:
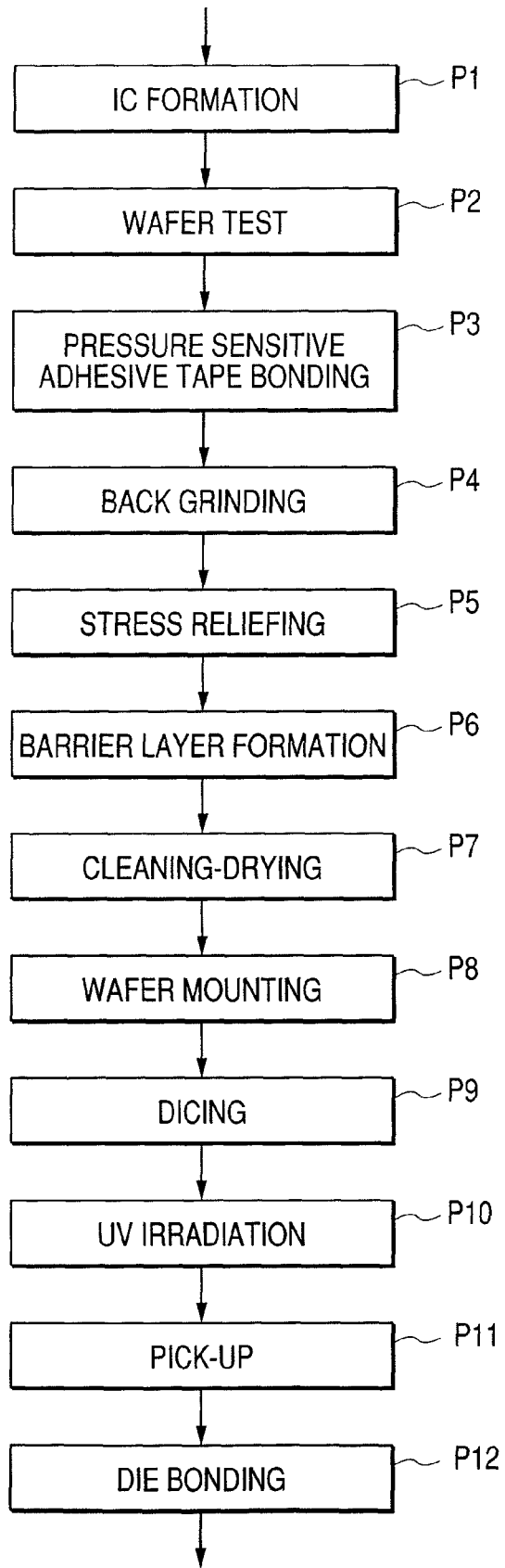
FIG. 14 is a process flow chart showing a method of fabrication of a semiconductor integrated circuit device representing another preferred embodiment of the invention.
Figure 19:
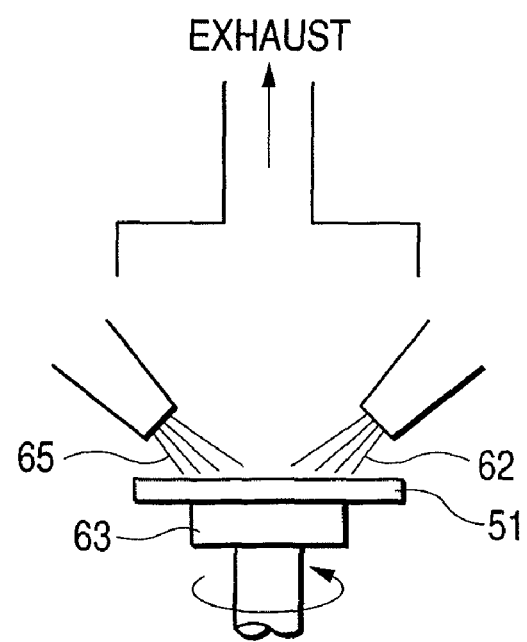
FIG. 19 is a diagram illustrating the formation of a barrier layer using ozonized water after stress relief, representing another embodiment according to the invention.
Figure 20:
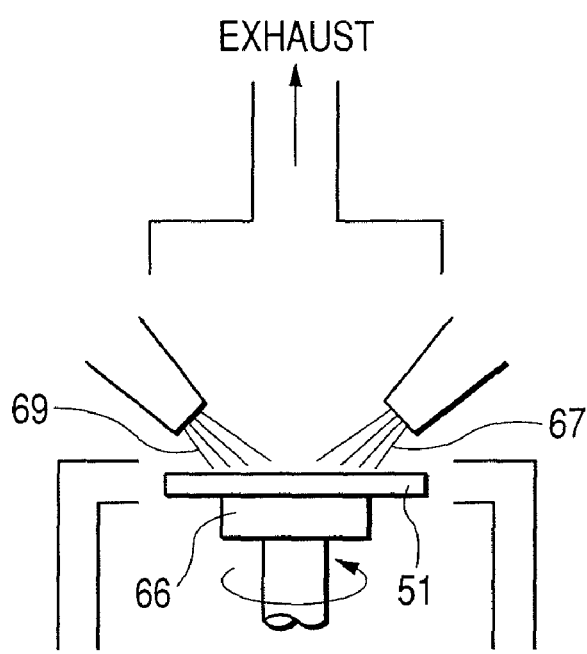
FIG. 20 is a diagram illustrating the formation of a barrier layer using nitric acid after stress relief, representing another embodiment according to the invention.
Figure 26:
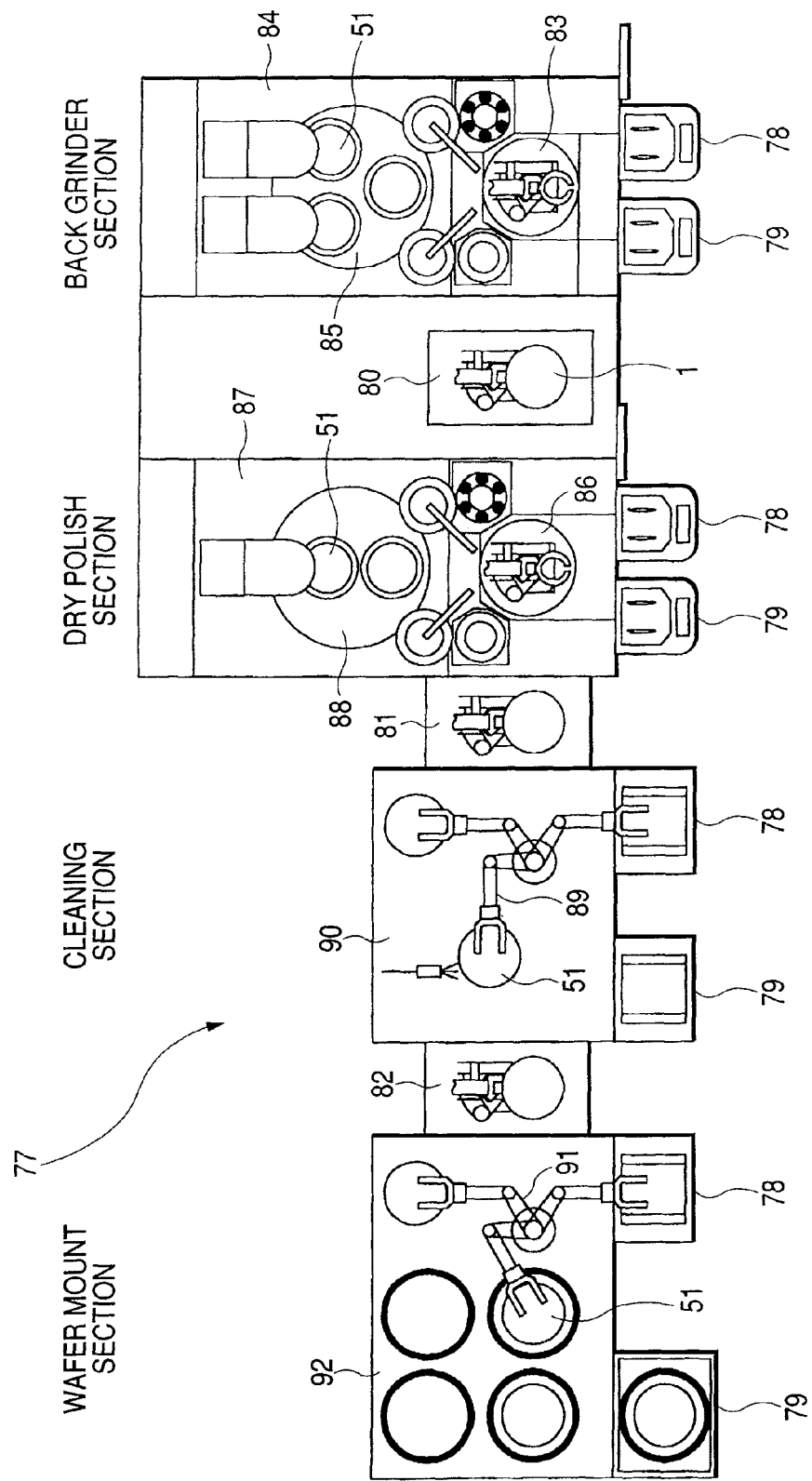
FIG. 26 is a diagram illustrating a through processing apparatus used, from back grinding to wafer mounting, in the fabrication of a semiconductor integrated circuit device representing another preferred embodiment according to the invention.
Figure 27:
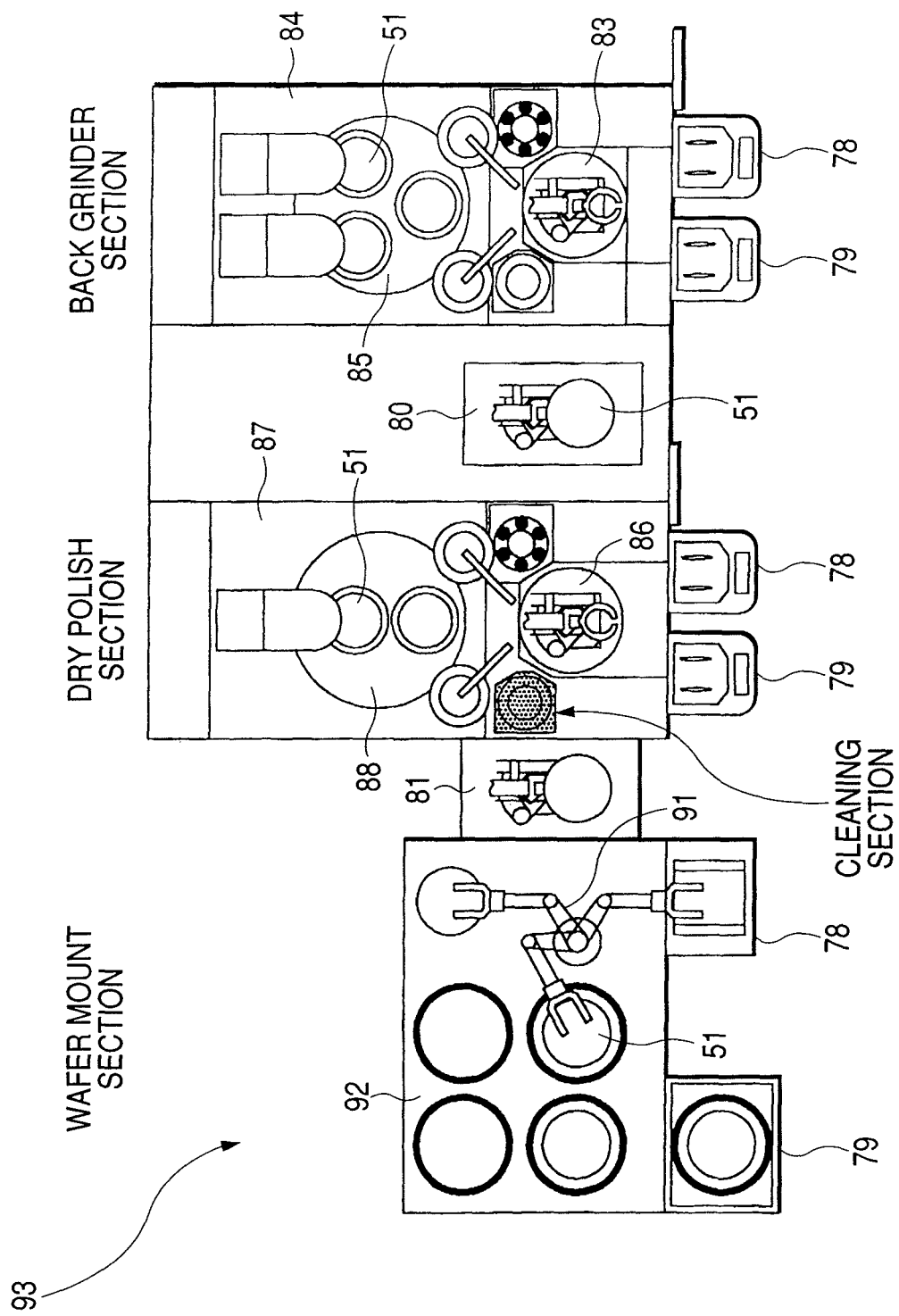
FIG. 27 is a diagram illustrating a through processing apparatus used, from back grinding to wafer mounting, in the fabrication of a semiconductor integrated circuit device representing another preferred embodiment according to the invention.
Figure 28:
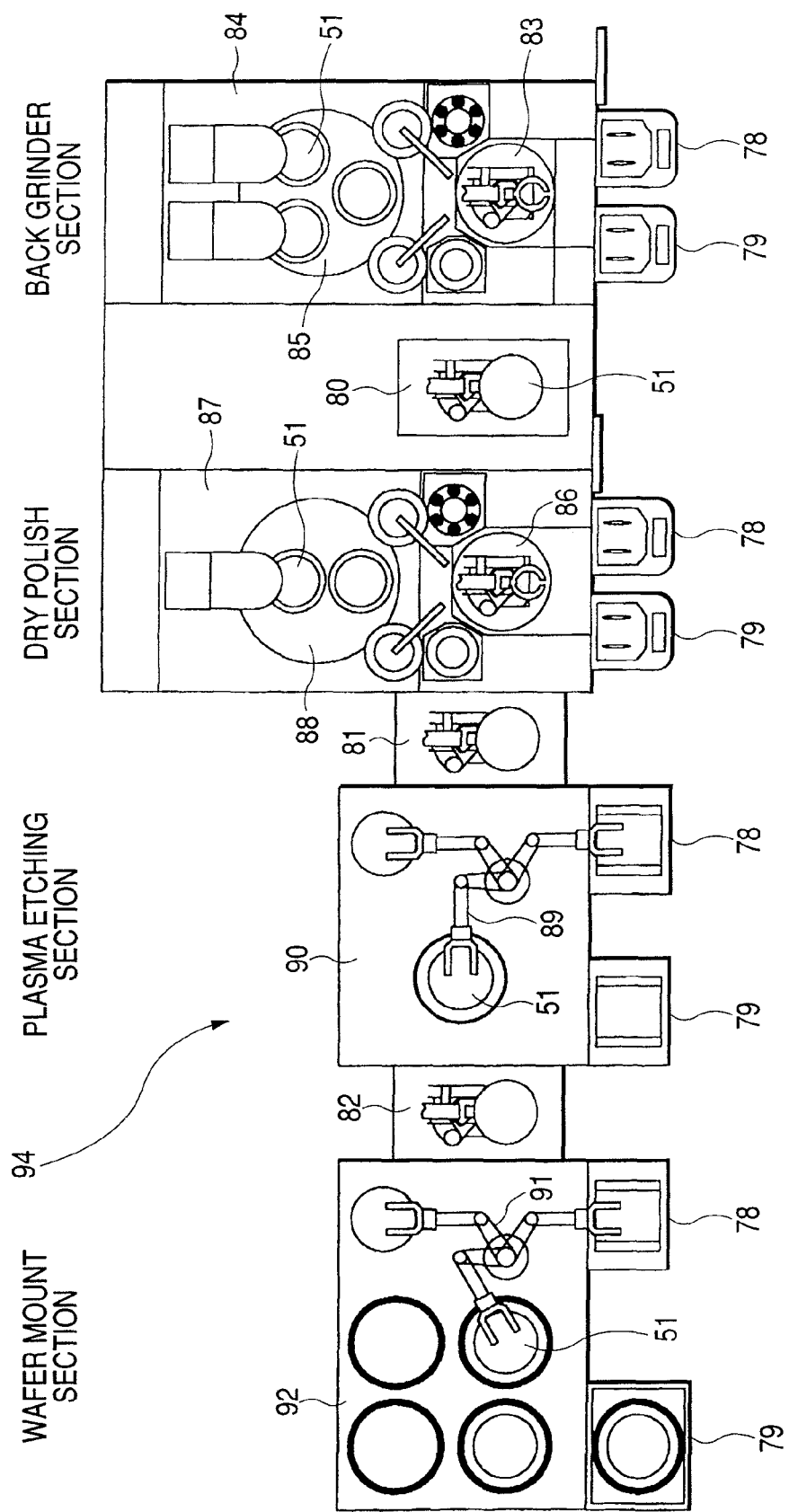
FIG. 28 is a diagram illustrating a through processing apparatus used, from back grinding to wafer mounting, in the fabrication of a semiconductor integrated circuit device representing a further preferred embodiment according to the invention.

The method fabrication of a semiconductor integrated circuit device according to Embodiment 2 will be described in the order of the steps thereof with reference to FIG. 14 to FIG. 28. FIG. 14 is a process flow chart for a method of fabrication of a semiconductor integrated circuit device, FIG. 15, FIG. 18 and FIGS. 21 to 25 are side elevational views showing a main portion of the semiconductor integrated circuit device, FIG. 16 is an enlarged view of the cross section at the back surface of the semiconductor integrated circuit device, FIG. 17 is a diagram showing a stress relief system, FIG. 19 is diagram showing the forming a barrier layer using ozonized water after stress relief, FIG. 20 is a diagram showing the forming of a barrier layer by using nitric acid after stress relief, and FIG. 26 to FIG. 28 are diagrams showing a through processing apparatus for performing process from back grinding to wafer mounting. The following description is directed only to each of the steps of the process from back grinding to die bonding of bonding individually divided chips on the substrate after forming a circuit pattern on a semiconductor wafer.

At first, an integrated circuit is formed on a circuit forming surface (first surface or first main surface) of a semiconductor wafer (step P1 in FIG. 14). The semiconductor wafer comprises silicon single crystals and has a diameter, for example, of 300 mm, and a thickness (first thickness), for example, of 700 μm or more.

Then, it is judged whether each of the chips prepared on the semiconductor wafer is intact or defective (step P2 in FIG. 14). For this purpose, a semiconductor wafer is placed on a measuring stage, a probe is brought into contact with an electrode pad of an integrated circuit and, when a signal waveform is inputted from an input terminal, a signal waveform is outputted from an output terminal. By reading the waveform using a tester, a chip is judged to determine whether it is intact or defective. In this case, a probe card in which probes are arranged corresponding to all electrode pads of the integrated circuit is used. Signal lines corresponding to each of the probes corresponding to each of the grooves is led out from the probe card and connected to the tester. A chip that is judged to be defective is indented with a defective mark.

Then, a pressure sensitive adhesive tape (first tape) is bonded to a circuit forming surface of the semiconductor wafer (step P3 in FIG. 14). The pressure sensitive adhesive tape may be a self-releasable tape, that is, a UV-cured type or thermosetting type or EV cured type tape. Further, it may be a non-UV-cured type of pressure sensitive adhesive tape, that is, it may be the usual pressure sensitive adhesive tape (not self releasable tape), which is not a thermosetting type, UV cured type or EB cured type. In the case of the non-self releasable tape, while the self-releasability is not available, it there are the advantages of avoiding a change of information written to a memory circuit, such as a non-volatile memory, a shift of characteristics or an undesirable change of the surface characteristics of a surface protective member, such as one made of a polyimide layer or a re-wiring insulative material, that are generated in a case of irradiating UV-rays (energy ray irradiation or heating) to a wafer device surface.

The following description will be directed to an example using a not self-releasable tape. A pressure sensitive adhesive is coated on a pressure sensitive adhesive tape by which the pressure sensitive adhesive tape is adhered with a circuit forming surface (device surface) of a semiconductor wafer. The pressure sensitive adhesive tape is formed, for example, of a polyolefin serving as a substrate, to which an acrylic adhesive is coated and on which a releasing material formed of polyester is further applied. The releasing member is, for example, releasing paper and the pressure sensitive adhesive tape is adhered to the semiconductor wafer after peeling the releasing material. The thickness of the pressure sensitive adhesive tape is, for example, from 130 to 150 μm and the adhesion is, for example, from 20 to 30 g/20 mm (indicated by strength of 20 mm tape releasing). A pressure sensitive adhesive tape having no releasing material, but which is subjected to a releasing treatment at the back thereof, may also be used.

Figure 15:
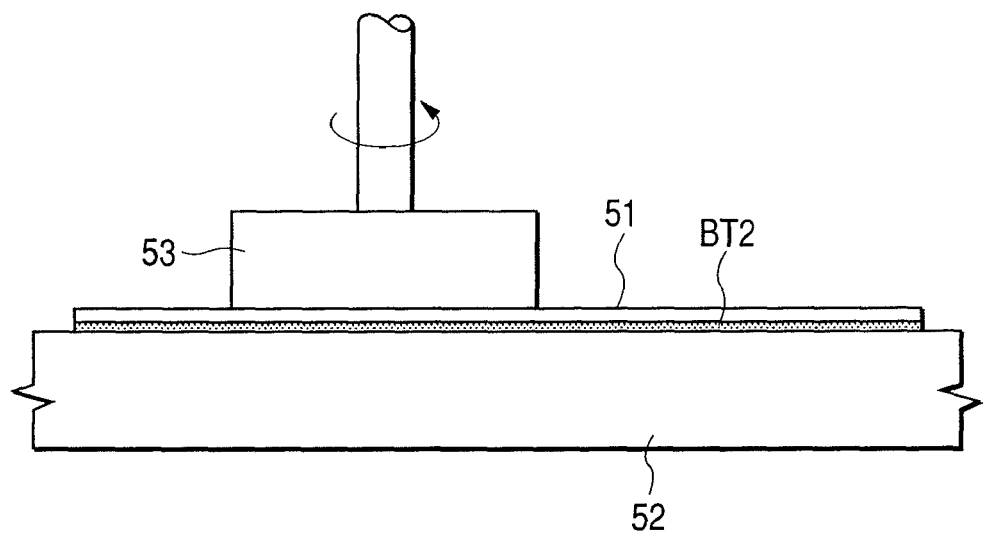
FIG. 15 is a side elevational view showing a main portion during a step in the manufacture of the semiconductor integrated circuit device representing another preferred embodiment of the invention.
Figure 16:
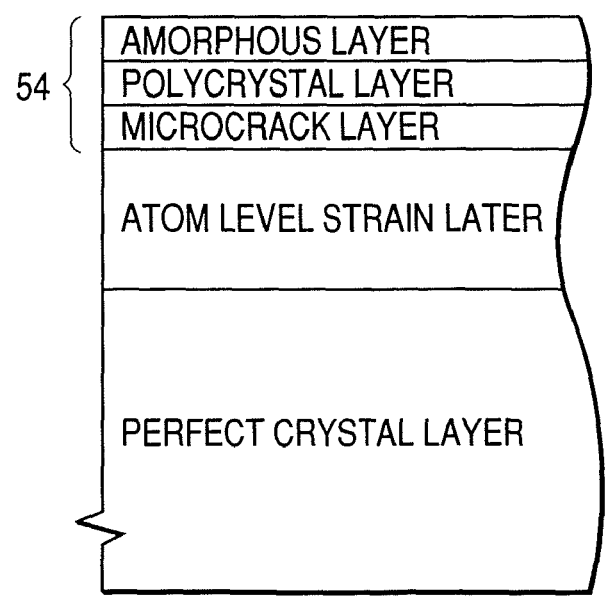
FIG. 16 is a diagrammatic enlarged cross sectional view of a main portion of a back surface portion of a semiconductor wafer.

Then, as shown in FIG. 15, the back surface of a semiconductor wafer 51 (surface opposite to the circuit forming surface; second main surface or second surface) is roughly ground to reduce the thickness of the semiconductor wafer 51 to less than 100 μm, less than 80 μm, or less 60 μm (step P3 in FIG. 14). The semiconductor wafer 51 is transported to a grinder device, and, after vacuum-adsorbing the circuit forming circuit of the semiconductor wafer 51 to a chuck table 52, a rotating grinding member 53 (for example, #320 to #360 roughness: number of protrusions: about 320 to 360 N per unit area, the same indication being used also in other portions) is urged to the back surface of the semiconductor wafer 51 to apply rough grinding to reduce the thickness of the semiconductor wafer 51 to a predetermined thickness (second thickness). Since the pressure sensitive adhesive tape BT2 is adhered to the circuit forming surface of the semiconductor wafer 51, the integrated circuit is not destroyed.

Then, the back surface of the semiconductor wafer 51 is subjected to finish grinding. In this case, after vacuum-adsorbing the circuit forming surface of the semiconductor wafer 51 to the chuck table using the same grinder device as shown in FIG. 2, a rotating grinding member (for example, #1500 or #2000 roughness) is urged to the back surface of the semiconductor wafer 51 to apply finish grinding, by which strains at the back surface of the semiconductor wafer 51 caused during rough grinding can be removed and the strength of the chip can be improved.

Then, grinding streaks produced in the back surface of the semiconductor wafer 1 by back grinding are removed (step P5 in FIG. 14). The back surface of the semiconductor wafer 51, with the circuit forming surface thereof being vacuum-adsorbed to the chuck table of the grinder device, is vacuum-adsorbed by a wafer transportation jig, the vacuum of the chuck table is broken and the semiconductor wafer 51 is held by the wafer transportation jig and the semiconductor wafer 51 is transported as it is to a stress relief device. Further, the semiconductor wafer 51, after being vacuum-adsorbed at the circuit forming surface thereof to the rotary table or pressing head of the stress relief device, is subjected to stress relief.

As shown in FIG. 16, while the strain layer at the atom level (stress transfer layer) and the crystal defect layer (amorphous layer/polycrystal layer/micro-crack layer: first layer) 54 are formed on a complete crystal layer on the back surface of the semiconductor wafer 51 in back grinding, the stress defect layer 54 is removed by stress relief. The thickness of the crystal defect layer 54 is, for example, about from 1 to 2 μm and the flexion strength of the chip can be improved by removing the crystal defect layer 54. When the crystal defect layer 54 is removed, a portion of the atom level strain layer may also be eliminated.

Figure 17A:
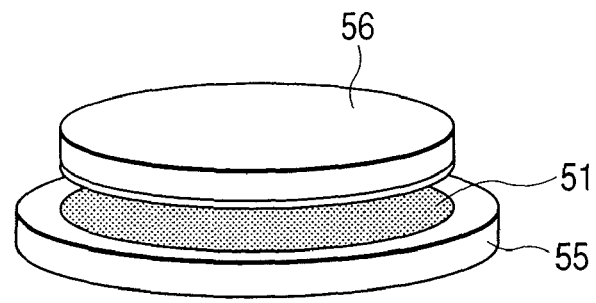
FIG. 17(a), FIG. 17(b) and FIG. 17(c) are, respectively, diagrams of an apparatus illustrating stress relief by a dry polishing method, a CMP method and a spin etching method, each representing another preferred embodiment of the invention.
Figure 17B:
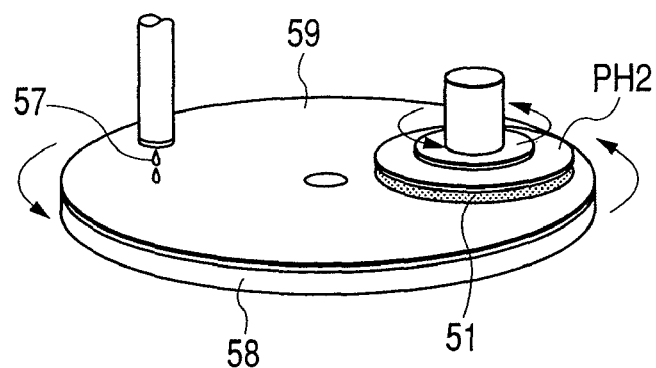
Figure 17C:
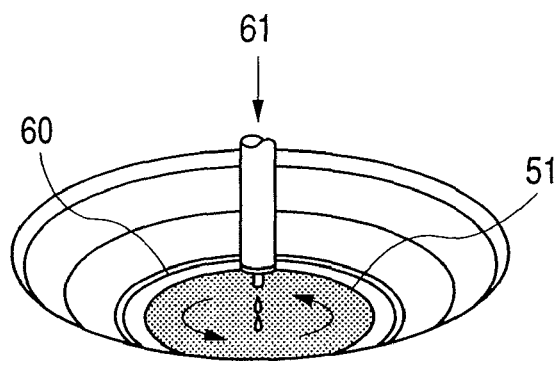

In the stress relief, a dry polishing method (FIG. 17(a)), a CMP method (FIG. 17(b)) or a chemical etching method (FIG. 17(c)) is used. The dry polishing method is a method of polishing the back surface of the semiconductor wafer 51, placed on a rotary table 55, with a polishing cloth 56 to which abrasive grains adhere (cloth formed by depositing silica by a binder to the surface of fibers and hardened into a pad shape, for example, of about 400 mmϕ, and about 26 mm thickness: dry polish wheel). The dry polishing method can reduce the cost compared with other methods, but it involves a problem in that the force exerted on the semiconductor wafer 51 tends to tip the periphery of the semiconductor wafer 51. The CMP method is a method in which the semiconductor wafer 51 is polished by a pressing head PH2, and polishing the semiconductor wafer 51 by press fitting the back surface thereof to a polishing pad 59 adhered to the surface of a platen 58, while a slurry flows (polishing abrasive solution) 57. While the CMP method can provide a uniform fabrication surface, since it requires a high material cost, such as for provision of the slurry 57, and an increased installation cost, this requires an overall higher cost than other methods. Further, in the chemical etching method a semiconductor wafer 51 is placed on a rotary table 60 and etched by using a fluoro nitric acid (HF+HNO$_3$) 61. While the chemical etching method has the advantages of removing a large amount, the disposal of gas wastes or liquid wastes is difficult, resulting in a large cost for treatment.

Figure 18:
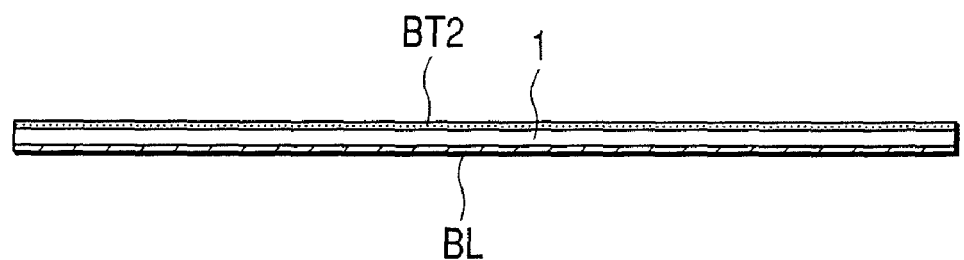
FIG. 18 is a side elevational view showing a main portion during a step in the fabrication of a semiconductor integrated circuit device succeeding the step of FIG. 15.

Then, as shown in FIG. 18, a barrier layer (second layer) BL is formed on the back surface of the semiconductor wafer 51 (step P6 in FIG. 14). A semiconductor wafer 51, which is vacuum-adsorbed to a rotary table or pressing head of a stress relief device, is vacuum-adsorbed by a wafer transportation jig, vacuum for the rotary table or the pressing head is broken and the semiconductor wafer 51 is held by the wafer transportation jig. The semiconductor wafer 51 is then transported as it is to a barrier layer forming device. The semiconductor wafer 51, having been transported to the barrier layer forming device, is vacuum-adsorbed at the circuit forming surface, for example, to a chuck table of the barrier layer forming device, and the barrier layer BL is formed at the back surface thereof.

When the stress relief has been completed, the crystal defect layer 54 is removed and the atom level strain layer is exposed to the back surface of the semiconductor wafer 51. Accordingly, when contamination impurities, for example, heavy metal impurities, are deposited to the back surface (atom level strain layer) of the semiconductor wafer 51, they easily invade into the semiconductor wafer 51. The contamination impurities invading into the semiconductor wafer 51 are diffused in the semiconductor wafer 51 and reach the circuit forming surface of the semiconductor wafer 51 so as to bring about a characteristic failure of the semiconductor device formed in the circuit forming surface. Thus, a barrier layer BL is formed on the back surface (atom level strain layer) of the semiconductor wafer 51 to suppress diffusion of the contamination impurities in the semiconductor wafer 51 by the barrier layer BL. Among the heavy metals, Cu has a diffusion coefficient of $6.8 \times 10^{-2}$/sec (at 150° C.), which is higher compared with the diffusion coefficient of other heavy metals (for example, Fe has a diffusion coefficient of $2.8 \times 10^-$ 13/sec (at 150° C.)) and tends to reach the circuit forming surface of the semiconductor wafer 51. Accordingly, it is considered to be one of the main contamination impurities causing a characteristic failure of a semiconductor device. It is considered that an appropriate range for the thickness of the barrier layer BL is, for example, 0.5 nm or more (since there is no practical problem so long as it is not less than the lower limit value capable of forming a stable layer, in a case of considering only the releasing characteristic of the tape) (the range is not restrictive but may vary depending on the condition). Further, it is considered that the range suitable to mass production is 1 nm or more (that is, a relatively large thickness is advantageous for ensuring the degree of freedom for various heat treatments), and it is considered that a range of 2 nm or more is most suitable.

The barrier layer BL is formed, for example, by any of the following first to seventh methods. In the first method, before cleaning the back surface of the semiconductor wafer 51 by using pure water after completion of stress relief, ozonized water formed by incorporating ozone into pure water is poured on the surface to form an oxide layer (barrier layer BL) on the back surface of the semiconductor wafer 51. The ozonized water is formed by an ozonized water forming device, such as shown in FIG. 5.

At first, as shown in FIG. 19, after electrolyzing ultra-pure water to generate an ozone gas, the ozone gas is dissolved in ultra-pure water to form ozonized water 62. Successively, ozonized water 62 is poured onto the back surface of the semiconductor wafer 51 for about 30 to 60 sec, such that ozonized water covers the entire back surface of the semiconductor wafer 51, which is placed on a rotary table 63, thereby forming an oxide layer (barrier layer BL) on the back surface of the semiconductor wafer 51. The speed of rotation of the rotary table 63 is, for example, 500 to 1000 rpm, and the temperature of the semiconductor wafer is a normal temperature. It is considered that the appropriate range for the concentration of ozonized water 62 is, for example, from 0.1 to 20 ppm (the range is not restrictive, but may vary depending on the condition). Further, it is considered that a range suitable to mass production is from 0.3 to 8 ppm, and, further, it is considered that a range around 1 to 2 ppm, such as from 0.6 to 4 ppm, is most suitable.

Then, pure water 65 is poured onto the back surface of the semiconductor wafer 51 so as to cover the entire back surface of the semiconductor wafer 51 placed on the rotary table 63 and the back surface of the semiconductor wafer 51 is cleaned. The speed of rotation of the rotary table 63 is, for example, 3000 rpm. In this embodiment, pure water 65 is poured after pouring the ozonized water 62 onto the back surface of the semiconductor wafer 51. However, this is not limitative, but pure water 65 may be supplied for a predetermined period in the midstream of pouring ozonized water 62, and then the supply of ozonized water may be stopped, followed by stopping the supply of pure water.

In the first method, since formation of the barrier layer BL on the back surface of the semiconductor wafer 51 and cleaning for the back surface of the semiconductor wafer 51 can be carried out, an increase in the number of steps can be avoided. In the first method, the running cost is inexpensive and clean oxidation can be obtained because of the use of ozonized water 62 not containing impurities in which an ozone gas is dissolved in ultra-pure water.

In the second method, cleaning water, which is formed by incorporating carbon dioxide ($CO_2$) into pure water, is poured before cleaning the back surface of the semiconductor wafer 51, after completion of stress relief, thereby forming an oxide layer (barrier layer BL) on the back surface of the semiconductor wafer 51. It is considered that an appropriate range of the concentration of $CO_2$ dissolved in pure water is, for example, from 1 to 1000 ppm (the range is not restrictive, but may vary depending on the condition). Further, it is considered that a range suitable to mass production is from 10 to 500 ppm, and, further, it is considered that a range around 100 to 200 ppm, such as from 80 to 300 ppm, is most suitable. The $CO_2$ water is formed by the $CO_2$-water forming step shown FIG. 7. In this embodiment, pure water is poured after pouring the $CO_2$ water onto the back surface of the semiconductor wafer 51. However, this is not limitative, but pure water may be supplied for a predetermined period in the midstream of pouring $CO_2$ water, and then the supply of $CO_2$ water may be stopped, followed by stopping the supply of pure water (Pure water cleaning is not always necessary. For example, a dry cleaning may be used. Pure water may be a cleaning chemical solution, or an aqueous solution containing a chemical agent, that is, a chemical liquid).

The second method has already been adopted in the fabrication of semiconductor integrated circuit devices and can be applied easily to the formation of the oxide layer (barrier layer BL) for the back surface of the semiconductor wafer 51. Further, in the second method, the running cost is inexpensive and clean oxidation can be carried out like the first method described above.

In the third method, $H_2O_2$-water formed by incorporating hydrogen peroxide ($H_2O_2$) into pure water is poured before cleaning the back surface of the semiconductor wafer 51, after completion of stress relief, thereby forming an oxide layer (barrier layer BL) on the back surface of the semiconductor wafer 51. However, this is not limitative, but pure water may be supplied for a predetermined period in the midstream of pouring $H_2O_2$ water, and then the supply of $H_2O_2$ water may be stopped, followed by stopping the supply of pure water. In the third method, clean oxidation can be carried out in the same manner as in the first method.

In the fourth method, before cleaning the back surface of the semiconductor wafer 51 by using pure water, after completion of stress relief, nitric acid ($HNO_3$) is poured to form an oxide layer (barrier layer BL) on the back surface of the semiconductor wafer 51. At first, as shown in FIG. 20, nitric acid 67 is poured onto the back surface of the semiconductor wafer 51, which is placed on a rotary table 66, for example, for about 30 to 60 sec so as to cover the entire back surface of the semiconductor wafer 51, thereby forming an oxide layer (barrier layer BL) on the back surface of the semiconductor wafer 51. The spaced of rotation of the rotary table 66 is, for example, from 500 to 1000 rpm. Then, pure water 69 is poured onto the back surface of the semiconductor wafer 51, which is placed on the rotary table 66, so as to cover the entire back surface of the semiconductor wafer 51, thereby cleaning the back surface of the semiconductor wafer 51. The speed of rotation of the rotary table 66 is, for example, 3000 rpm. In this embodiment, pure water 69 is poured after pouring nitric acid 67 onto the back surface of the semiconductor wafer 51. However, this is not limitative, but, for example, after pouring pure water 69 from the midway of pouring nitric acid 67, the supply of nitric acid 67 may be stopped, followed by stopping the supply of pure water 69.

In the fifth method, a micro crystal defect (barrier layer BL) is formed on the back surface of the semiconductor wafer 51 after completion of stress relief. Contamination impurities, particularly, heavy metal impurities, tend to be concentrated in the crystal defect layer, and invasion of the contamination impurities from the back surface of the semiconductor wafer 51 can be prevented by intentionally forming the micro-crystal defect layer. The micro-crystal defect layer can be formed, for example, as described below. For example, ions are generated by plasma discharge and they are caused to impinge on the surface to form a damage layer (micro-crystal defect layer) on the back surface of semiconductor wafer 51. The plasma conditions comprise, for example, use of $CF_4$ or $CF_6$ as a gas, from 1 to 1.8 Torr of vacuum degree (133.322 to 239.980 Pa), 15 to 20° C. of temperature, and about one min of time, or use of Cl as a gas, 20 to 50 mm Torr of vacuum degree (2666.45 to 6666.12 mPa), from 15 to 25° C. of temperature, and about one hour. Under these conditions, a micro-crystal defect layer with a thickness, for example, of about 2 to 10 nm is formed. The method of forming the damage layer by the use of plasma can provide an advantage in cleaning the back surface of the semiconductor wafer 51 by the use of plasma in that a plasma damage layer is formed on the cleaned back surface, so that at the same time, an oxide layer (insulative layer or like other auxiliary layer) is formed as a impurity diffusion layer or a releasability improving layer onto the surface of the damage layer. On the other hand, a liquid treatment has an advantage of producing less damage, although not providing the above-mentioned three effects in combination. Particularly, the method of using pure water incorporated with various kinds of gases (gas-incorporated pure water) can provide an additional advantage of reducing the running cost.

Alternatively, a pulverized layer (micro-crystal defect layer) is formed on the back surface of the semiconductor wafer 51 by sand blasting. At first, the back surface of the semiconductor wafer 51 is exposed and a masking material is formed. For the masking material, a resist pattern formed by lithography can be used, for instance. Successively, abrasive grains are sprayed, together with a gas pressurized, for example, to about 2 to 3 kgf/cm², to clean the back surface of the semiconductor wafer 51, and, further, a pulverized layer is formed on the cleaned back surface. The abrasive grains are, for example, SiC or aluminum and the grain size is, for example, about several to several hundreds μm. Then, the masking material is removed and the semiconductor wafer 51 is cleaned.

Alternatively, in the stress relief, the crystal defect layer (amorphous layer/polycrystal layer/micro-crack layer) 54 is not removed entirely, but the crystal defect layer 54 is left partially, which is used as the micro-crystal defect layer.

Alternatively, the back surface of the semiconductor wafer 51 is ground by using a fine mesh abrasive stone to form a micro-crystal defect layer. In the grinding, a grinder device like that shown in FIG. 2 can be used. That is, after vacuum-adsorption of the circuit forming surface of the semiconductor wafer 51 to a chuck table, a rotating grinding member (for example, #8000 to #10000 roughness) is urged to the back surface of the semiconductor wafer 51 and grinding is carried out to form a micro-crystal defect layer. In the formation of the micro-crystal defect layer, a grinding material with finer roughness than the rough grinding (for example, from #320 to #360 roughness of grinding member) is used, and then finishing grinding (roughness #1500 to #2000 of grinding member) is carried out.

In the sixth method, impurities are ion implanted into the back surface of the semiconductor 51, after completion of stress relief, to form a damage layer (barrier layer BL). The ion injection conditions comprise, for example, as ion species, 150 keV of energy, and $5\times10^{15}$ cm$^{-2}$ of the dose rate.

In the seventh method, an oxide layer or a polycrystal silicon layer is deposited on the back surface of the semiconductor wafer 51 as a barrier layer BL by a plasma CVD method for preventing intrusion of contamination impurities. That is, contamination impurities are deposited in the oxide layer or the polycrystal silicon layer. The plasma CVD conditions for forming the oxide layer comprise, for example, use of $O_2$ as a gas, a vacuum degree of 3 to 4 Torr (399.967 to 533.289 Pa), a temperature of 400° C. and of about 10 sec of time. Under the conditions, a barrier layer BL, having a thickness of, for example, about 30 nm, can be formed.

Figure 21:
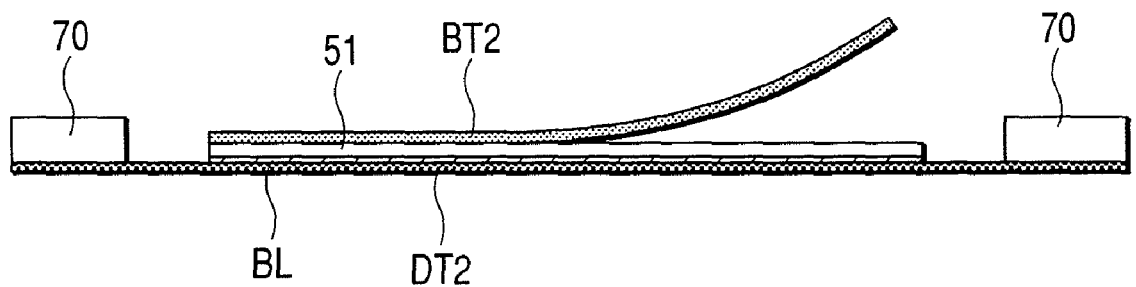
FIG. 21 is a side elevational view showing a main portion during a step in the fabrication of a semiconductor integrated circuit device succeeding the step of FIG. 18.

Then, after cleaning and drying the semiconductor wafer 51 (step 7 in FIG. 14), as shown in FIG. 21, the semiconductor wafer 51 is transferred and adhered to a dicing tape DT2 (step P8 in FIG. 14). After completion of the formation of the barrier layer BL, the semiconductor wafer 51 is vacuum-adsorbed by a wafer transport jig and transported as it is to a mounting device. The semiconductor wafer 51, having been transported to a mounting device, is at first sent to an alignment station for alignment by a notch or orientation flat and then the semiconductor wafer 51 is sent to a wafer mounting station for wafer mounting. In the wafer mounting, a circular frame 70 previously adhered with a dicing tape DT2 is provided, and the semiconductor wafer 51 is adhered to the dicing tape DT2 with the circuit forming surface facing upwarded. The dicing tape DT2 comprises, for example, a polyolefin substrate, on which an acrylic UV cured type adhesive is coated, and a releasing material made of polyester is adhered thereon. The releasing material is, for example, releasing paper, and the pressure sensitive adhesive tape is adhered, after peeling the releasing material, to the semiconductor wafer 51. The dicing tape DT2 has a thickness, for example, of 90 μm and an adhesion strength, for example, of 200 g/25 mm before UV-irradiation, and from 10 to 20 g/25 mm after UV irradiation. A pressure sensitive adhesive tape having no releasing material, but subjected to a releasing treatment at the back of the substrate may also be used.

Then, the frame 70 mounted with the semiconductor wafer 51 is sent to a pressure sensitive tape releasing station. In this station, the semiconductor wafer 51 and the pressure sensitive tape BT2 are released. The semiconductor wafer 51 is transferred and adhered again to the frame 70, because it is necessary to use the circuit forming surface having alignment marks as the upper surface, since dicing is carried out in the subsequent dicing step with reference to the alignment mark formed on the circuit forming surface of the semiconductor wafer 51 as a reference. Even when the pressure sensitive adhesive tape BT2 is released, since the semiconductor wafer 51 is secured by way of the dicing tape DT2 adhered to the frame 70, warping in the semiconductor wafer 51 does not occur.

Figure 22:
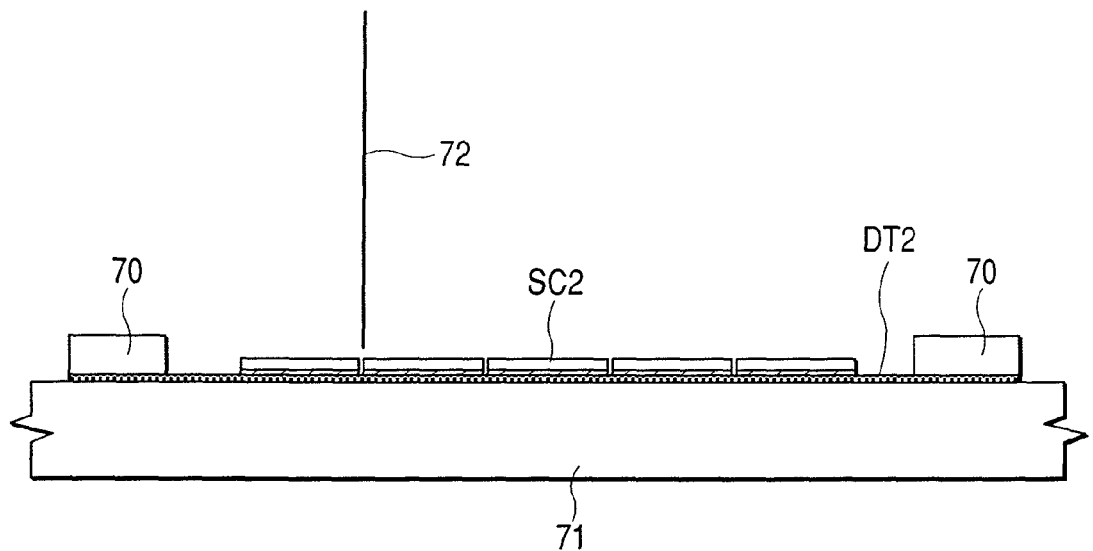
FIG. 22 is a side elevational view showing a main portion during a step in the fabrication of a semiconductor integrated circuit device succeeding the step of FIG. 21.

Then, as shown in FIG. 22, the semiconductor wafer 51 is subjected to dicing (step P9 in FIG. 14). While the semiconductor wafer 51 is divided into individual chips SC2, since respective chips SC2 are secured by way of the dicing tape DT2 to the frame 70 after being divided individually, they are maintained in an arranged state. At first, the semiconductor wafer 51 is vacuum-adsorbed by a wafer transportation jig at the circuit forming surface of the semiconductor wafer 51, and then it is transported as it is to the dicing device and placed on a dicing table 71. Successively, the semiconductor wafer 51 is cut longitudinally and laterally along scribe lines by using an extremely thin circular blade 72 bonded with fine diamond grains, which is referred to as a diamond saw (wafer may be divided by a method using a laser light. This can provide an additional advantage of reducing the cut width extremely).

Figure 23:
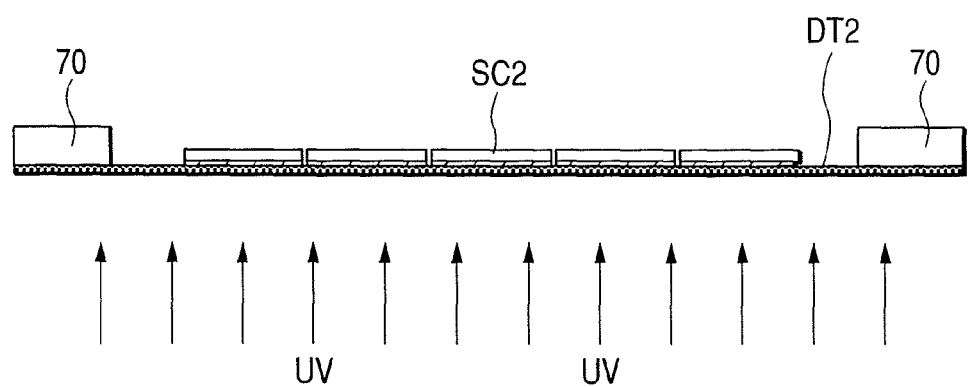
FIG. 23 is a side elevational view showing a main portion during a step in the fabrication of a semiconductor integrated circuit device succeeding the step of FIG. 22.

Then, as shown in FIG. 23, UV-rays are irradiated to the semiconductor wafer 51 (step P10 in FIG. 14). UV-rays are irradiated from the back of the dicing tape DT2 to lower the adhesion of the dicing tape DT2 at the surface in contact with each chip SC, for example, to about 10 to 20 g/25 mm. This makes each of the chips releasable easily from the dicing tape DT2.

Figure 24:
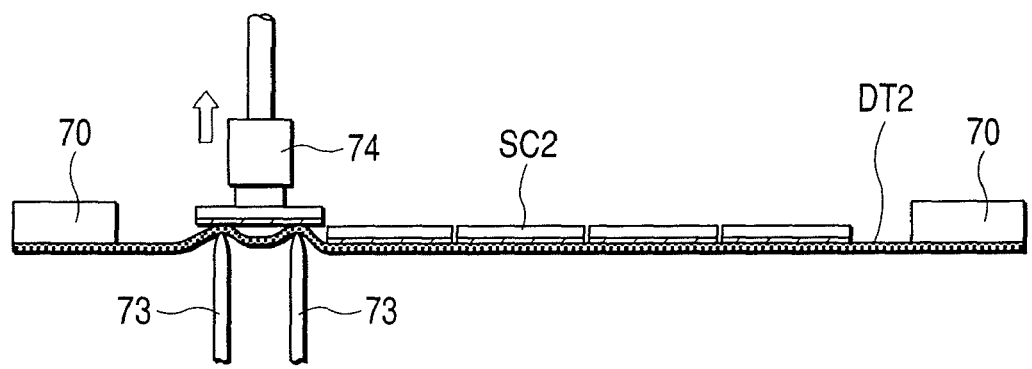
FIG. 24 is a side elevational view showing a main portion during a step in the fabrication of a semiconductor integrated circuit device succeeding the step of FIG. 23.

Then, as shown in FIG. 24, a chip SC that is judged to be intact at the step P2 in FIG. 14 is picked-up (step P11 in FIG. 14). The back surface of the chip SC2 is pressed by a push pin 73 by way of a dicing tape DT2 to release the chip SC from the dicing tape DT2. Successively, a collet 74 moves to a position above and opposed to the push-up pin 73, and the circuit forming surface of the released chip SC2 is vacuum-adsorbed by the collet 74, and the chips SC2 are thereby released and picked-up from the dicing tape DT2 one by one. Since adhesion between the dicing tape DT2 and the chip SC2 is weakened by UV-irradiation, even a thin chip SC2 of reduced strength can be picked-up reliably. The collet 74 has, for example, a substantially cylindrical outer profile, and an adsorption portion situated at the bottom is formed, for example, of soft synthetic rubber.

Figure 25:
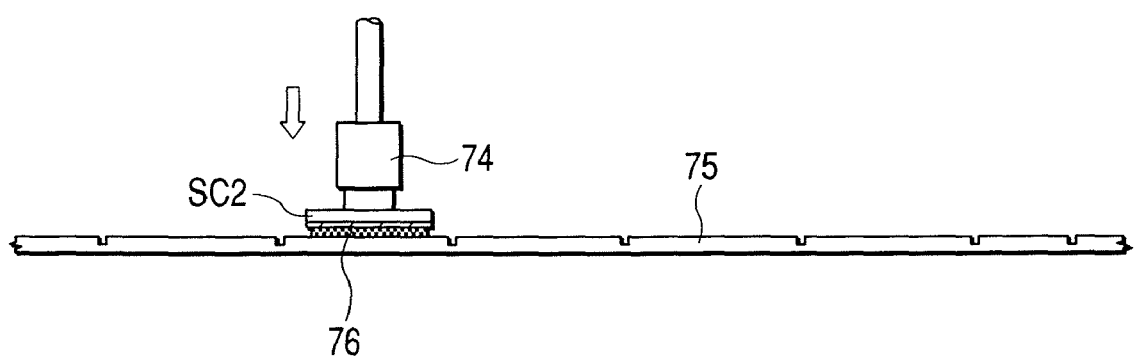
FIG. 25 is a side elevational view showing a main portion during a step in the fabrication of a semiconductor integrated circuit device succeeding the step of FIG. 24.

Then, the chip SC2 is mounted on a substrate 75 (step P12 in FIG. 14), as shown in FIG. 25. The picked-up chip SC2 is adhered and retained to the collet and transported to a predetermined position on the substrate 75. Successively, a paste material 76 is placed on a plated island of the substrate 75, to which the chip SC2 is pressed lightly and subjected to a hardening treatment at a temperature of about 100 to 200° C. Thus, the chip SC2 is bonded to the substrate 75. The paste material 76 can include, for example, epoxy resin, polyimide resin, acrylic resin or silicone resin. Further, in addition to adhesion using the paste material 76, it may be adhered by slightly rubbing the back surface of the chip SC2 to the plated island, or a small piece of a gold tape may be interposed between the plated island and the chip SC2 to prepare eutectic crystals of gold and silicon.

After completing the die bonding of intact chips that have adhered to the dicing tape DT2 and removal of failed chips, the dicing tape DT2 is released from the frame 70 and the frame 70 is recycled.

Then, electrodes on the chip SC2 and electrodes on the substrate 75 are connected electrically, and, further, the chip SC2 is sealed with a mold resin and protected. Successively, a product name or the like is stamped on the mold resin and individual chips are divided from the substrate 75. Then, the finished chips SC2 are selected in accordance with standards for products, and products are completed by way of an inspection step.

As described above, the crystal defect layer 54 on the back surface of the semiconductor wafer 51, which is ground to reduce the thickness, for example, to less than 100 μm, is removed by stress relief for increasing the flexion strength of the chip SC2. According to Embodiment 2, since the barrier layer BL (for example, oxide layer, micro-crystal defect layer, damage layer, etc.) is formed on the back surface of the semiconductor wafer 51 (or a portion of the crystal defect layer 54 is left), invasion of contamination impurities from the back surface of the semiconductor wafer 51 by the removal of the crystal defect layer 54 can be prevented, and, further, diffusion of the contamination impurities to the circuit forming surface of the semiconductor wafer 51 can be prevented. This can prevent the characteristic failure of the semiconductor device attributable to the contamination impurities intruding from the back surface of the semiconductor wafer 51, and a lowering of the production yield for the semiconductor product by the elimination of the crystal defect layer 54 can be suppressed.

Now, an example of continuous processing from back grinding (step P4 in FIG. 14) to wafer mounting (step P8 in FIG. 14) will be described with reference to a through processing apparatus, as shown in FIG. 26 to FIG. 28.

A through processing apparatus 77 shown in FIG. 26 comprises a back grinder station, a dry polishing station, a cleaning station and a wafer mounting station. While the dry polishing method is described as an example of stress relief, a CMP method or a chemical etching method may also be used. Further, while a cleaning station using ozonized water (first method described above) has been indicated as an example for forming the barrier layer BL, $CO_2$-water (second method), $H_2O_2$-water (third method) or nitric acid (fourth method) may also be used. Each of the stations is provided with a loader 78 for carrying-in the semiconductor wafer 51, and an unloader 79 for carrying-out the wafer 51, and each of the stations can also be used as a stand alone unit. Further, a transportation robot 80 is provided between the back grinder station and the dry polishing station for transporting the semiconductor wafer 51 between both stations. In the same manner, a transportation robot 81 is provided between the dry polishing station and the cleaning station and a transportation robot 82 is provided between the cleaning station and the wafer mounting station for transporting the semiconductor wafer 51 between the stations, respectively.

At first, after placing a FOUP mounting plural semiconductor wafers 51 on a loader 78 in the back grinder station, a single semiconductor wafer 51 is taken out by the transportation robot 83 from the FOUP and carried into a processing chamber 84 in the back grinder station. The FOUP is a tightly closed container for batch transportation of the semiconductor wafers and contains semiconductor wafers, usually, in a unit of 25, 12, or 6 sheets, etc. The container outer wall of the FOUP has an air tight structure, except for a fine ventilation filter portion whereby dust is excluded substantially completely. Accordingly, even for transportation in a class 1000 atmosphere, the inside can be kept at class 1 cleanliness. Docking with the apparatus is conducted so as to maintain the cleanliness by drawing the FOUP's door to the inside by the robot on the side of the apparatus. Successively, after placing the semiconductor wafer 51 on the chuck table 85 and conducting vacuum-adsorption, the back surface of the semiconductor wafer 51 is ground to reduce the thickness of the semiconductor wafer 51 to a predetermined thickness.

Then, after the completion of back grinding for the semiconductor wafer 51, the semiconductor wafer 51 is carried-out by a transportation robot 80 from the back grinder station and carried-into the dry polishing station, and, further, the semiconductor wafer 1 is carried by a transportation robot 86 into a processing chamber 87 in the dry polishing station. After placing the semiconductor wafer 1 on a chuck table 88 under vacuum adsorption, the crystal defect layer 54 is removed from the back surface of the semiconductor wafer 51.

Then, after the completion of dry polishing for the semiconductor wafer 51, the semiconductor wafer 51 is carried-out by the transportation robot 81 from the dry polishing station and transported to the cleaning station, and, further, the semiconductor wafer 51 is carried by a transportation robot 89 into a processing chamber 90 of the cleaning apparatus. The processing chamber 90 has a constitution, for example, as shown in FIG. 19, in which ozonized water is poured on the back surface of the semiconductor wafer 51. This forms an oxide layer on the back surface of the semiconductor wafer 51.

Then, after the completion of cleaning with pure water for the semiconductor wafer 51, the semiconductor wafer 51 is carried-out by the transportation robot 82 from the cleaning station and transported to the wafer mounting station. After vacuum-adsorbing the back surface of the semiconductor wafer 51 by a transportation robot 91, the vacuum adsorption surface of the semiconductor wafer 51 is exchanged and the circuit forming surface is vacuum-adsorbed. Successively, the semiconductor wafer 51 is carried into the processing chamber 92 in the wafer mounting station. In this station, after adhering the semiconductor wafer 51, with the circuit forming surface facing upwarded, to a dicing tape that is adhered and secured to a circular frame, the semiconductor wafer 51 is adhered, with the circuit forming surface facing upwarded, to the dicing tape, and then the pressure sensitive adhesive tape BT2 is released. Then, the semiconductor wafer 51 is transported to the unloader 79 for the wafer mounting station, and the semiconductor wafer 51 is taken out from the wafer mounting station and returned to the FOUP.

In the through processing apparatus 93 shown in FIG. 27, the cleaning station of the through processing apparatus shown in FIG. 26 is provided in the wafer discharge region of the dry polishing station.

In the through processing apparatus 94 shown in FIG. 28, the cleaning station in the through processing apparatus shown in FIG. 26 is replaced with a plasma etching station. While plasma etching is shown as an example for forming the barrier layer BL, other methods of forming the barrier layer BL may also be used. For example, the cleaning station can be replaced with a sand blasting station, a fine mesh abrading station, an ion implantation station or a plasma CVD portion.

As described above, the semiconductor wafer 51 can be processed in a short time from back grinding to wafer mounting by using the through processing apparatus 77, 93, or 94. Further, since the barrier layer BL is formed on the back surface of the semiconductor wafer 51, intrusion of contamination impurities from the back surface of the semiconductor wafer 51 can be prevented.

While Embodiments 1 and 2 have been described separately, basic features of the former and the latter are not different, but have a close relationship with each other from a technical point of view, and, for example, the object of the latter can be attained by the example of the former. Further, although not described in detail, the examples in the present application include application of the countermeasure of the former and that of the latter in combination. Further, it will be apparent that a similar countermeasure in the former and that in the latter (or in both of them) can be applied in combination.

While the invention made by the present inventors has been described specifically by way of preferred embodiments, it will be apparent that the invention is not limited to the embodiments described above but, can be changed variously within a scope not departing from the gist thereof.

For example, while the first to seventh methods are considered in Embodiment 1 as the methods of forcibly oxidizing the back surface of the semiconductor wafer, they are not limitative, and other techniques capable of oxidizing the back surface of the semiconductor wafer into the deactivated state can also be applied. Further, while first to seventh methods have been considered in Embodiment 2 as methods of forming a barrier layer on the back-surface of the semiconductor wafer, they are not limitative, but other techniques capable of preventing the intrusion of the contamination impurities from the back surface of the semiconductor wafer can also be applied.

According to the embodiments described above, when the semiconductor wafer is fabricated into a thin film and then the back surface thereof is forcibly oxidized or formed to have an adhesive suppression layer, separation of chips is obtained by dividing or substantially dividing the semiconductor wafer (not restricted to dicing but, for example, laser dicing or the like is also possible) from the wafer retention member (not restricted to that by push-up member, but also by using supersonic waves. Further, they may be used in combination).

Further, according to the embodiments described above, since a barrier layer capable of preventing intrusion of the contamination impurities is formed on the back surface of the semiconductor wafer after stress relief, diffusion of contamination impurities to the circuit forming surface of the semiconductor wafer can be prevented, thereby to suppress the occurrence of the characteristic failure of semiconductor devices.

The present invention is applied to a post step of assembling chips into products, which is conducted after the pre-step of forming the circuit pattern on the semiconductor wafer and checking the chips one by one.

What is claimed is:

1. A fabrication method of a semiconductor integrated circuit device comprising the steps of:
   (a) providing a semiconductor wafer having a first main surface and a second main surface which is opposite to said first main surface, said semiconductor wafer having a circuit pattern formed over said first main surface and a first thickness;
   (b) grinding said second main surface of said semiconductor wafer, thereby making said semiconductor wafer have a second thickness, which is thinner than said first thickness;
   (c) after the step (b), etching said second main surface of said semiconductor wafer to relieve stress of said second main surface of said semiconductor wafer caused by said grinding,
   (d) after the step (c), forcibly forming an oxidation film on said second main surface of said semiconductor wafer, so as to form a forcibly formed oxidation film;
   (e) after the step (d), adhering a dicing tape over said second main surface of said semiconductor wafer such that said dicing tape contacts with said forcibly formed oxidation film;
   (f) after the step (e), dicing said semiconductor wafer, thereby dividing said semiconductor wafer into individual chips; and
   (g) after the step (f), removing said individual chips from said dicing tape.

2. A fabrication method of a semiconductor integrated circuit device according to claim 1, wherein said etching for stress-relief is performed by a spin-etching method.

3. A fabrication method of a semiconductor integrated circuit device according to claim 1, wherein the diameter of semiconductor wafer is about 300 mm.

4. A fabrication method of a semiconductor integrated circuit device according to claim 1, wherein the first thickness of the semiconductor wafer is 700 μm or more.

5. A fabrication method of a semiconductor integrated circuit device according to claim 4, wherein the second thickness of the semiconductor wafer is less than 60 μm.

* * * * *